United States Patent
Pendse

(10) Patent No.: US 9,679,811 B2
(45) Date of Patent: *Jun. 13, 2017

(54) SEMICONDUCTOR DEVICE AND METHOD OF CONFINING CONDUCTIVE BUMP MATERIAL WITH SOLDER MASK PATCH

(71) Applicant: STATS ChipPAC, Ltd., Singapore (SG)

(72) Inventor: Rajendra D. Pendse, Fremont, CA (US)

(73) Assignee: STATS ChipPAC Pte. Ltd., Singapore (SG)

( * ) Notice: Subject to any disclaimer, the term of this patent is extended or adjusted under 35 U.S.C. 154(b) by 69 days.

This patent is subject to a terminal disclaimer.

(21) Appl. No.: 14/144,906

(22) Filed: Dec. 31, 2013

(65) Prior Publication Data

US 2014/0113446 A1    Apr. 24, 2014

Related U.S. Application Data

(60) Division of application No. 12/963,919, filed on Dec. 9, 2010, now Pat. No. 8,659,172, which is a
(Continued)

(51) Int. Cl.
*H01L 21/76* (2006.01)
*H01L 21/768* (2006.01)
(Continued)

(52) U.S. Cl.
CPC ...... *H01L 21/76885* (2013.01); *H01L 21/563* (2013.01); *H01L 23/3128* (2013.01);
(Continued)

(58) Field of Classification Search
CPC .... H01L 21/768; H01L 21/76; H01L 21/7688
(Continued)

(56) References Cited

U.S. PATENT DOCUMENTS 5,378,859 A    1/1995 Shirasaki et al.
5,386,624 A    2/1995 George et al.
(Continued)

FOREIGN PATENT DOCUMENTS

JP    04-355933    9/1992
JP    10-256307    9/1998
(Continued)

OTHER PUBLICATIONS

Yamada, Hiroshi et al., "Advanced copper column based solder bump for flip-chip interconnection", International Symposium on Microelectronics, 1997, pp. 417-422, The British Library—"The world's knowledge".

(Continued)

*Primary Examiner* — Chuong A Luu
(74) *Attorney, Agent, or Firm* — Robert D. Atkins; Atkins and Associates, P.C.

(57) ABSTRACT

A semiconductor device has a semiconductor die having a plurality of die bump pad and substrate having a plurality of conductive trace with an interconnect site. A solder mask patch is formed interstitially between the die bump pads or interconnect sites. A conductive bump material is deposited on the interconnect sites or die bump pads. The semiconductor die is mounted to the substrate so that the conductive bump material is disposed between the die bump pads and interconnect sites. The conductive bump material is reflowed without a solder mask around the die bump pad or interconnect site to form an interconnect structure between the semiconductor die and substrate. The solder mask patch confines the conductive bump material within the die bump pad or interconnect site. The interconnect structure can include a fusible portion and non-fusible portion. An encapsulant is deposited between the semiconductor die and substrate.

25 Claims, 19 Drawing Sheets

Related U.S. Application Data continuation-in-part of application No. 12/633,531, filed on Dec. 8, 2009, now Pat. No. 8,198,186.

(60) Provisional application No. 61/141,782, filed on Dec. 31, 2008.

(51) Int. Cl.

| | | |
|---|---|---|
| *H01L 21/56* | (2006.01) | |
| *H01L 23/31* | (2006.01) | |
| *H01L 23/498* | (2006.01) | |
| *H05K 3/34* | (2006.01) | |
| *H01L 23/00* | (2006.01) | |

(52) U.S. Cl.
CPC ...... *H01L 23/498* (2013.01); *H01L 23/49816* (2013.01); *H01L 23/49838* (2013.01); *H01L 24/81* (2013.01); *H01L 24/97* (2013.01); *H05K 3/3436* (2013.01); *H05K 3/3452* (2013.01); *H01L 23/3171* (2013.01); *H01L 24/13* (2013.01); *H01L 24/16* (2013.01); *H01L 24/48* (2013.01); *H01L 24/73* (2013.01); *H01L 2224/10145* (2013.01); *H01L 2224/10175* (2013.01); *H01L 2224/131* (2013.01); *H01L 2224/1308* (2013.01); *H01L 2224/13082* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/16013* (2013.01); *H01L 2224/16014* (2013.01); *H01L 2224/16105* (2013.01); *H01L 2224/16225* (2013.01); *H01L 2224/16235* (2013.01); *H01L 2224/27013* (2013.01); *H01L 2224/32145* (2013.01); *H01L 2224/4823* (2013.01); *H01L 2224/48091* (2013.01); *H01L 2224/48227* (2013.01); *H01L 2224/48228* (2013.01); *H01L 2224/73203* (2013.01); *H01L 2224/73265* (2013.01); *H01L 2224/81097* (2013.01); *H01L 2224/81191* (2013.01); *H01L 2224/81192* (2013.01); *H01L 2224/81193* (2013.01); *H01L 2224/81194* (2013.01); *H01L 2224/81208* (2013.01); *H01L 2224/81815* (2013.01); *H01L 2224/97* (2013.01); *H01L 2924/00013* (2013.01); *H01L 2924/00014* (2013.01); *H01L 2924/014* (2013.01); *H01L 2924/0105* (2013.01); *H01L 2924/01006* (2013.01); *H01L 2924/01013* (2013.01); *H01L 2924/01015* (2013.01); *H01L 2924/01027* (2013.01); *H01L 2924/01029* (2013.01); *H01L 2924/01047* (2013.01); *H01L 2924/01049* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/1433* (2013.01); *H01L 2924/181* (2013.01); *H01L 2924/19041* (2013.01); *H01L 2924/19042* (2013.01); *H01L 2924/19043* (2013.01); *H01L 2924/30105* (2013.01); *H05K 2201/09909* (2013.01); *H05K 2201/10674* (2013.01); *Y02P 70/613* (2015.11)

(58) Field of Classification Search
USPC ....................... 438/613, 106, 107
See application file for complete search history.

(56) References Cited

U.S. PATENT DOCUMENTS

| | | | |
|---|---|---|---|
| 5,434,410 | A | 7/1995 | Kulwicki |
| 5,508,561 | A | 4/1996 | Tago et al. |
| 5,519,580 | A | 5/1996 | Natarajan et al. |
| 5,650,595 | A | 7/1997 | Bentlage et al. |
| 5,710,071 | A | 1/1998 | Beddingfield et al. |
| 5,844,782 | A | 12/1998 | Fukasawa |
| 5,869,886 | A | 2/1999 | Tokuno |
| 5,872,399 | A | 2/1999 | Lee |
| 5,889,326 | A | 3/1999 | Tanaka |
| 5,915,169 | A | 6/1999 | Heo |
| 5,985,456 | A | 11/1999 | Zhou et al. |
| 6,050,481 | A * | 4/2000 | Chapman ............ B23K 3/0623 228/180.22 |
| 6,201,305 | B1 | 3/2001 | Darveaux et al. |
| 6,218,630 | B1 | 4/2001 | Takigami |
| 6,228,466 | B1 | 5/2001 | Tsukada et al. |
| 6,259,163 | B1 | 7/2001 | Ohuchi et al. |
| 6,281,450 | B1 | 8/2001 | Urasaki et al. |
| 6,297,560 | B1 | 10/2001 | Capote et al. |
| 6,324,754 | B1 | 12/2001 | DiStefano et al. |
| 6,329,605 | B1 | 12/2001 | Beroz et al. |
| 6,335,568 | B1 | 1/2002 | Yuzawa et al. |
| 6,335,571 | B1 | 1/2002 | Capote et al. |
| 6,396,707 | B1 | 5/2002 | Huang et al. |
| 6,441,316 | B1 | 8/2002 | Kusui |
| 6,448,665 | B1 | 9/2002 | Nakazawa et al. |
| 6,573,610 | B1 | 6/2003 | Tsai |
| 6,600,234 | B2 | 7/2003 | Kuwabara et al. |
| 6,608,388 | B2 | 8/2003 | Lin et al. |
| 6,678,948 | B1 | 1/2004 | Benzler et al. |
| 6,710,458 | B2 | 3/2004 | Seko |
| 6,734,557 | B2 | 5/2004 | Taniguchi et al. |
| 6,774,497 | B1 | 8/2004 | Qi et al. |
| 6,780,673 | B2 | 8/2004 | Venkateswaran |
| 6,787,918 | B1 | 9/2004 | Tsai et al. |
| 6,809,262 | B1 | 10/2004 | Hsu |
| 6,812,410 | B2 * | 11/2004 | Sakamoto ........... H01L 21/4832 174/260 |
| 6,818,545 | B2 | 11/2004 | Lee et al. |
| 6,849,944 | B2 | 2/2005 | Murtuza et al. |
| 6,870,276 | B2 | 3/2005 | Moxham et al. |
| 6,888,255 | B2 | 5/2005 | Murtuza et al. |
| 6,913,948 | B2 | 7/2005 | Caletka et al. |
| 7,005,585 | B2 | 2/2006 | Ishizaki |
| 7,005,750 | B2 | 2/2006 | Liu |
| 7,049,705 | B2 | 5/2006 | Huang |
| 7,057,284 | B2 | 6/2006 | Chauhan et al. |
| 7,064,435 | B2 | 6/2006 | Chung et al. |
| 7,098,407 | B2 | 8/2006 | Kim et al. |
| 7,102,239 | B2 | 9/2006 | Pu et al. |
| 7,173,828 | B2 | 2/2007 | Lin et al. |
| 7,224,073 | B2 | 5/2007 | Kim |
| 7,242,099 | B2 | 7/2007 | Lin et al. |
| 7,271,484 | B2 | 9/2007 | Reiss et al. |
| 7,294,929 | B2 | 11/2007 | Miyazaki |
| 7,317,245 | B1 | 1/2008 | Lee et al. |
| 7,405,484 | B2 | 7/2008 | Usui et al. |
| 7,436,063 | B2 | 10/2008 | Miyata et al. |
| 7,521,284 | B2 | 4/2009 | Miranda et al. |
| 7,642,660 | B2 | 1/2010 | Tay et al. |
| 7,670,939 | B2 | 3/2010 | Topacio et al. |
| 7,671,454 | B2 | 3/2010 | Seko |
| 7,732,913 | B2 | 6/2010 | Hsieh et al. |
| 7,750,457 | B2 | 7/2010 | Seko |
| 7,790,509 | B2 | 9/2010 | Gerber |
| 7,791,211 | B2 | 9/2010 | Chen et al. |
| 7,847,399 | B2 | 12/2010 | Masumoto |
| 7,847,417 | B2 | 12/2010 | Araki et al. |
| 7,851,928 | B2 | 12/2010 | Gallegos et al. |
| 7,898,083 | B2 | 3/2011 | Castro |
| 7,902,660 | B1 | 3/2011 | Lee et al. |
| 7,902,678 | B2 | 3/2011 | Ohuchi et al. |
| 7,902,679 | B2 | 3/2011 | Lin et al. |
| 7,932,170 | B1 | 4/2011 | Huemoeller et al. |
| 7,947,602 | B2 | 5/2011 | Ito et al. |

(56) References Cited

U.S. PATENT DOCUMENTS

| | | |
|---|---|---|
| 8,198,186 B2 * | 6/2012 | Pendse .................. 438/613 |
| 8,278,144 B2 | 10/2012 | Pendse |
| 8,476,761 B2 | 7/2013 | Pendse et al. |
| 2003/0127720 A1 | 7/2003 | Fang |
| 2004/0056341 A1 | 3/2004 | Endo et al. |
| 2004/0108135 A1 * | 6/2004 | Ashida ............... H01L 23/3128 174/260 |
| 2004/0232562 A1 | 11/2004 | Hortaleza et al. |
| 2005/0103516 A1 * | 5/2005 | Kaneyuki ............. H01L 21/563 174/560 |
| 2005/0248037 A1 | 11/2005 | Hung et al. |
| 2006/0131758 A1 | 6/2006 | Dao |
| 2006/0216860 A1 | 9/2006 | Pendse |
| 2006/0255473 A1 | 11/2006 | Pendse |
| 2007/0018308 A1 * | 1/2007 | Schott et al. ................ 257/700 |
| 2007/0200234 A1 | 8/2007 | Gerber et al. |
| 2008/0093749 A1 | 4/2008 | Gerber et al. |
| 2008/0179740 A1 * | 7/2008 | Liao ................. H01L 23/49816 257/738 |
| 2008/0213941 A1 | 9/2008 | Pendse |
| 2008/0277802 A1 | 11/2008 | Tsai et al. |
| 2009/0108445 A1 | 4/2009 | Liang |
| 2009/0114436 A1 | 5/2009 | Chen et al. |
| 2009/0152716 A1 | 6/2009 | Sohara |
| 2009/0160045 A1 * | 6/2009 | Sun et al. ................ 257/699 |
| 2009/0184419 A1 | 7/2009 | Pendse |
| 2009/0191329 A1 | 7/2009 | Wang |
| 2009/0236730 A1 * | 9/2009 | Topacio et al. ............ 257/701 |
| 2009/0250811 A1 | 10/2009 | Pendse |
| 2009/0288866 A1 | 11/2009 | Tsai et al. |
| 2009/0308647 A1 | 12/2009 | Liao |
| 2009/0325348 A1 * | 12/2009 | Gerber .................. 438/120 |
| 2010/0139965 A1 | 6/2010 | Wang et al. |
| 2011/0049703 A1 | 3/2011 | Hsu et al. |

FOREIGN PATENT DOCUMENTS

| | | |
|---|---|---|
| JP | 2000-031204 | 1/2000 |
| JP | 2004-221205 | 5/2004 |
| TW | 459360 B | 10/2001 |
| TW | 529141 B | 4/2003 |
| TW | 200945456 A | 11/2009 |

OTHER PUBLICATIONS

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Son, Ho Young et al., "Studies on the Thermal Cycling Reliability of Fine Pitch Cu/SnAg Double-Bump Flip Chip Assemblies on Organic Substrates: Experimental Results and Numerical Analysis", Electronic Components and Technology Conference, 2008, pp. 2035-2043.

Lu, H. et al., "Predicting Optimal Process Conditions for Flip-Chip Assembly Using Copper column Bumped Dies", Electronics Packaging Technology Conference, 2002, pp. 338-343.

Kawahara, Toshimi, "SuperCSP", IEEE Transactions on Advanced Packaging, May 2000, pp. 215-219, vol. 23, No. 2.

\* cited by examiner

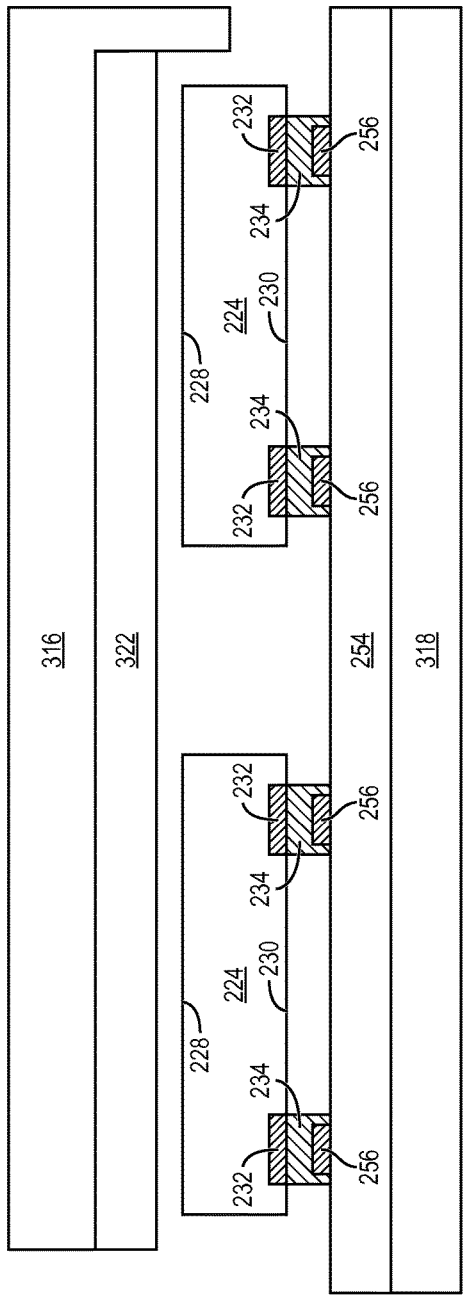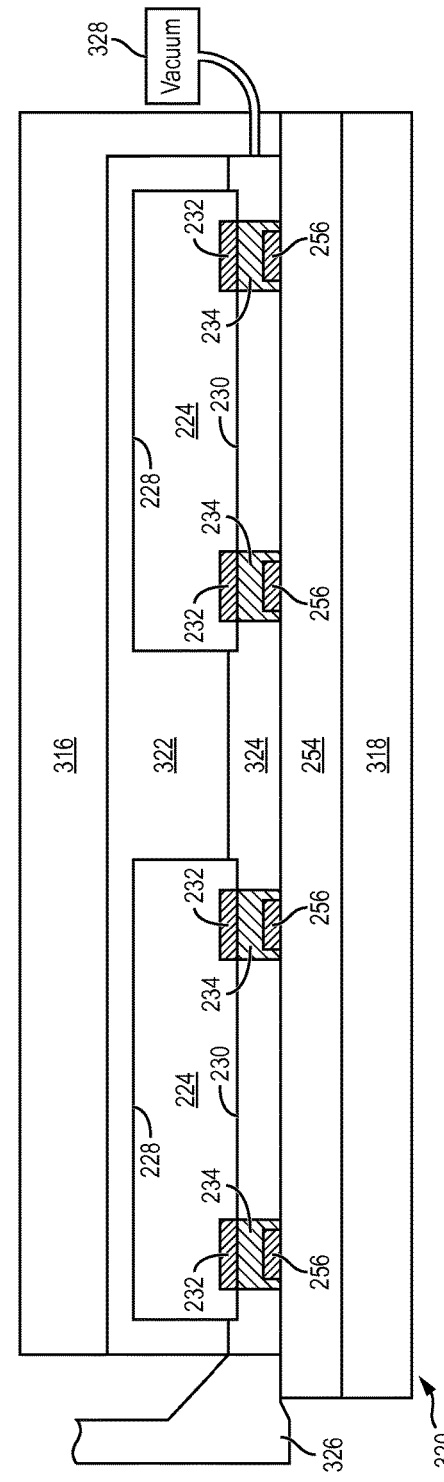

SEMICONDUCTOR DEVICE AND METHOD OF CONFINING CONDUCTIVE BUMP MATERIAL WITH SOLDER MASK PATCH

CLAIM TO DOMESTIC PRIORITY

The present application is a division of U.S. patent application Ser. No. 12/963,919, now U.S. Pat. No. 8,659,172, filed Dec. 9, 2010, which is a continuation-in-part of U.S. patent application Ser. No. 12/633,531, now U.S. Pat. No. 8,198,186, filed Dec. 8, 2009, which claims the benefit of U.S. Provisional Application No. 61/141,782, filed Dec. 31, 2008.

FIELD OF THE INVENTION

The present invention relates in general to semiconductor devices and, more particularly, to a semiconductor device and method of confining conductive bump material during reflow with solder mask patch.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

FIGS. 1 and 2 illustrate a cross-sectional view and top view of a portion of flipchip type semiconductor die 10 and interconnects or bumps 12 metallurgically and electrically connected between bump pads 18 as formed on semiconductor die 10 and trace lines 20 and 22 as formed on substrate 30. Trace line 22 is routed between traces lines 20 and bumps 12 on substrate 30. Trace lines 20 and 22 are electrical signal conductors with optional bump pads for mating to bumps 12-14. Solder mask 26 overlays trace lines 20 and 22. Solder mask or registration openings (SRO) 28 are formed over substrate 30 to expose trace lines 20 and 22. SRO 28 confines the conductive bump material on the bump pads of trace lines 20 and 22 during reflow and prevents the molten bump material from leaching onto the trace lines, which can cause electrical shorts to adjacent structures. SRO 28 is made larger than the trace line or bump pad. SRO 28 is typically circular in shape and made as small as possible to reduce the pitch of trace lines 20 and 22 and increase routing density.

In typical design rules, the minimum escape pitch of trace line 30 is defined by $P=(1.1D+W)/2+L$, where D is bump base diameter, W is trace line width, and L is the ligament separation between SRO and adjacent structures. Using a solder registration design rule of ±30 micrometers (μm), D of 100 μm, W of 20 μm, and L of 30 μm, the minimum escape pitch of trace lines 30-34 is $(1.1*100+20)/2+30=95$ μm. SRO 28 around the bump pads limits the escape pitch and routing density of the semiconductor die.

SUMMARY OF THE INVENTION

A need exists to minimize escape pitch of trace lines for higher routing density. Accordingly, in one embodiment, the present invention is a method of making a semiconductor device comprising the step of providing a substrate. The substrate includes a plurality of first interconnect sites. The method further comprises the step of providing a semiconductor die. The semiconductor die includes a plurality of second interconnect sites. The method further comprises the steps of forming a plurality of solder mask patches between the first interconnect sites or second interconnect sites, and forming an interconnect structure between the first and second interconnect sites.

In another embodiment, the present invention is a method of making a semiconductor device comprising the step of providing a substrate. The substrate includes first and second interconnect sites. The method further comprises the steps of forming a solder mask patch between the first and second interconnect sites, and forming an interconnect structure over the first interconnect site and confined within the first interconnect site by the solder mask patch.

In another embodiment, the present invention is a method of making a semiconductor device comprising the step of providing a substrate. The substrate includes a first interconnect site. The method further comprises the steps of forming a first solder mask patch over the substrate, and forming an interconnect structure over the first interconnect site and confined within the first interconnect site by the first solder mask patch.

In another embodiment, the present invention is a method of making a semiconductor device comprising the step of providing a substrate. The substrate includes a first interconnect site and second interconnect site. The method further comprises the step of disposing a solder mask between the first and second interconnect sites.

BRIEF DESCRIPTION OF THE DRAWINGS

FIGS. 15a-15c illustrate mold underfill between the semiconductor die and substrate;

DETAILED DESCRIPTION OF THE DRAWINGS

Figure 1:
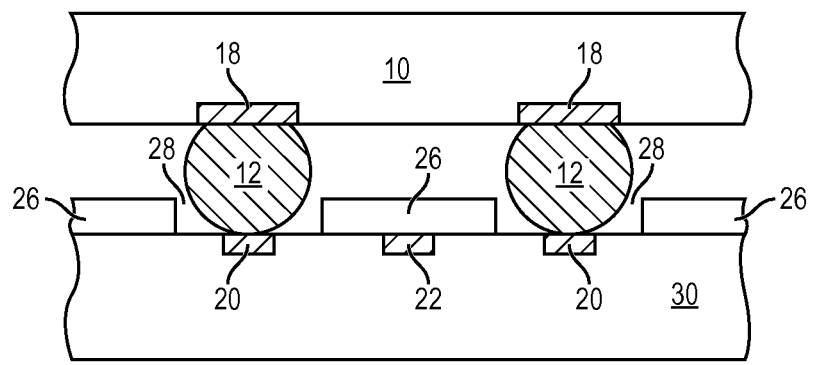
FIG. 1 illustrates a cross-sectional view of conventional interconnects formed between a semiconductor die and trace lines on a substrate.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
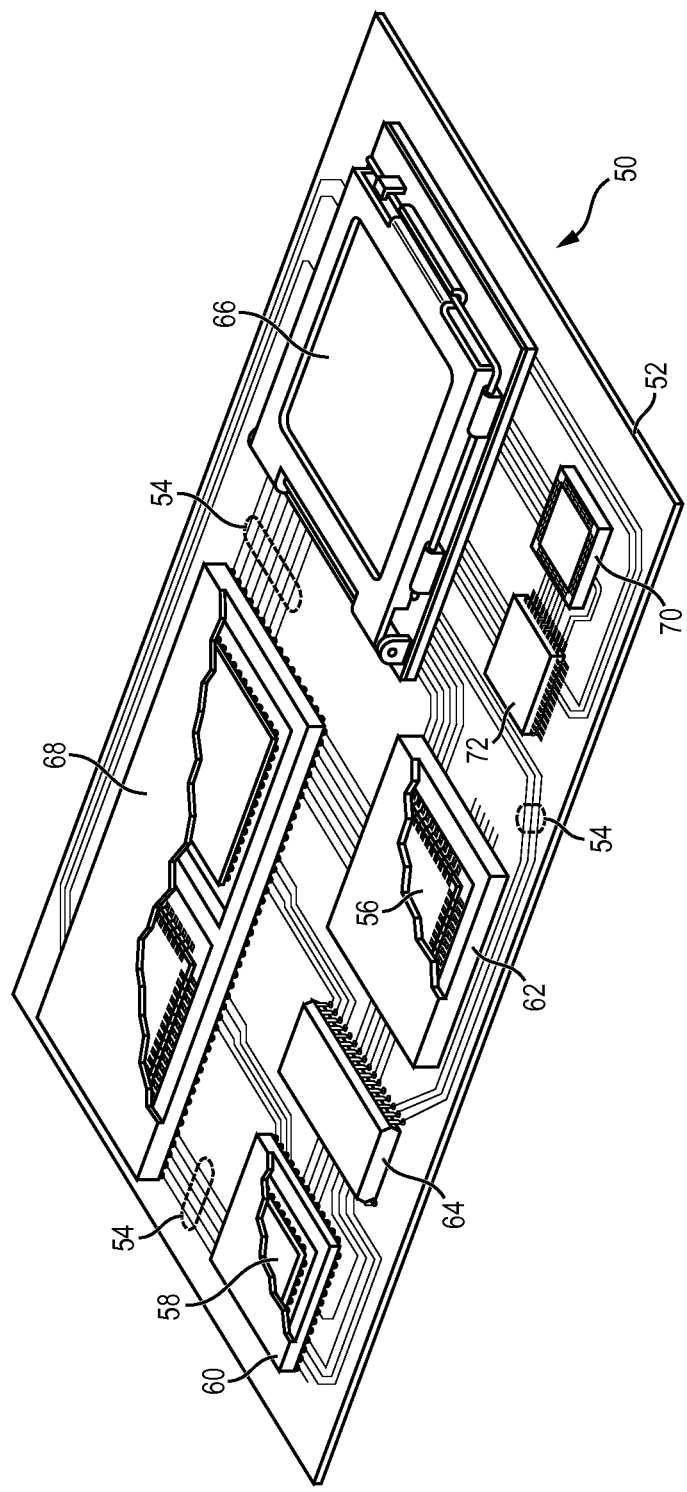
FIG. 3 illustrates a PCB with different types of packages mounted to its surface.

FIG. 3 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 3 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 4A:
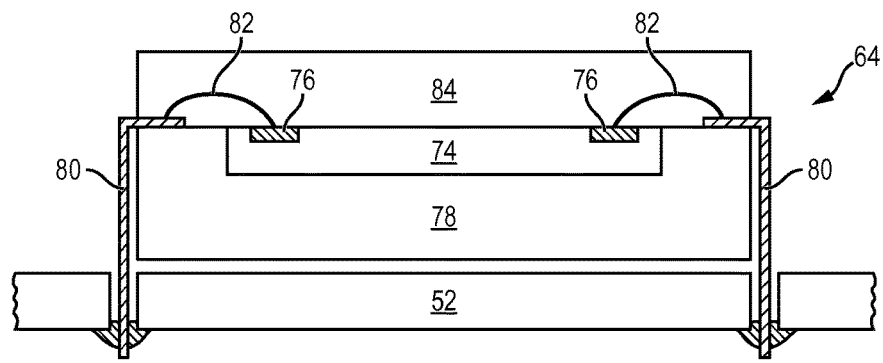
FIGS. 4a-4d illustrate further detail of the representative semiconductor packages mounted to the PCB.
Figure 4B:
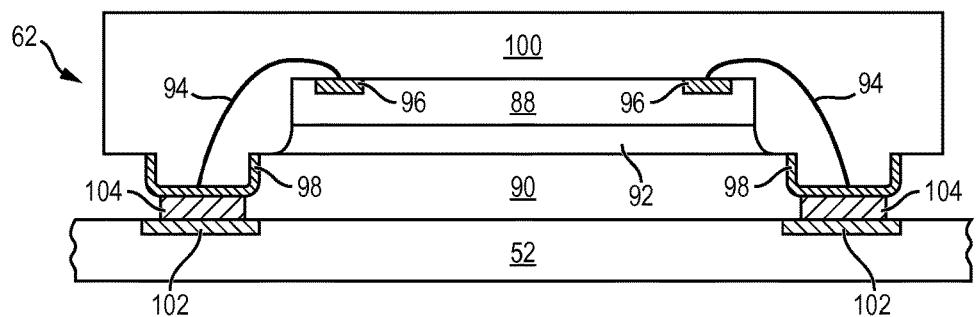
Figure 4C:
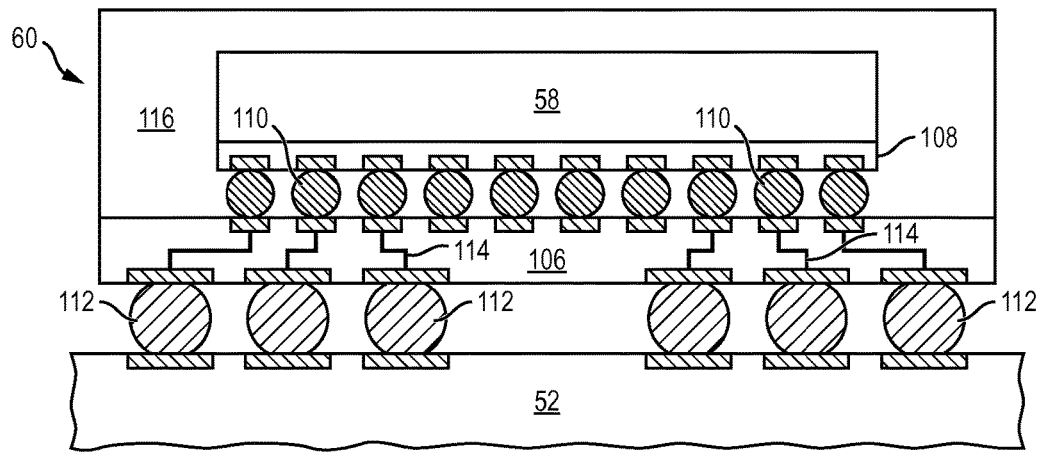

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 4b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 4c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4D:
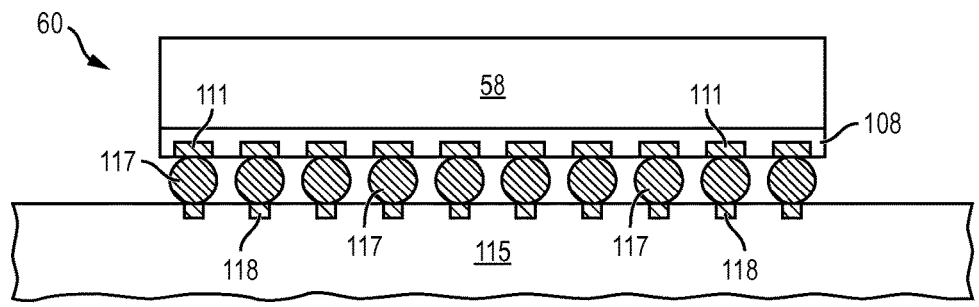

In another embodiment, active area 108 of semiconductor die 58 is directly mounted facedown to PCB 115, i.e., without an intermediate carrier, as shown in FIG. 4d. Bump pads 111 are formed on active area 108 using an evaporation, electrolytic plating, electroless plating, screen printing, or other suitable metal deposition process. Bump pads 111 connect to the active and passive circuits by conduction tracks in active area 108. Bump pads 111 can be Al, Sn, Ni, Au, Ag, or Cu. An electrically conductive bump material is deposited over bump pads 111 or conduction tracks 118 in PCB 115 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux material. For example, the bump material can be eutectic Sn/Pb, high-lead solder, or lead-free solder. The bump material is bonded between die bump pads 111 and conduction tracks 118 on PCB 115 using a suitable attachment or bonding process. In one embodiment, the bump material is reflowed by heating the material above its melting point to form spherical balls or bumps 117. The flip chip semiconductor device provides a short electrical conduction path from the active devices on semiconductor die 58 to conduction tracks 118 on PCB 115 in order to reduce signal propagation, lower capacitance, and achieve overall better circuit performance.

Figure 5:
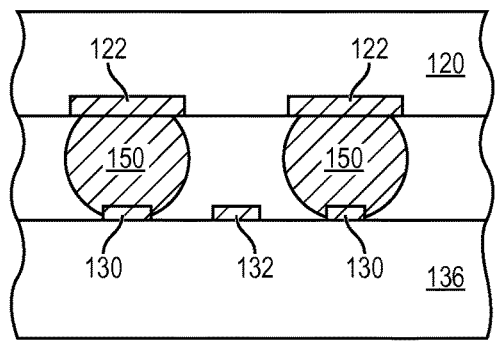
FIG. 5 illustrates interconnects formed between a semiconductor die and trace lines on a substrate.
Figure 6A:
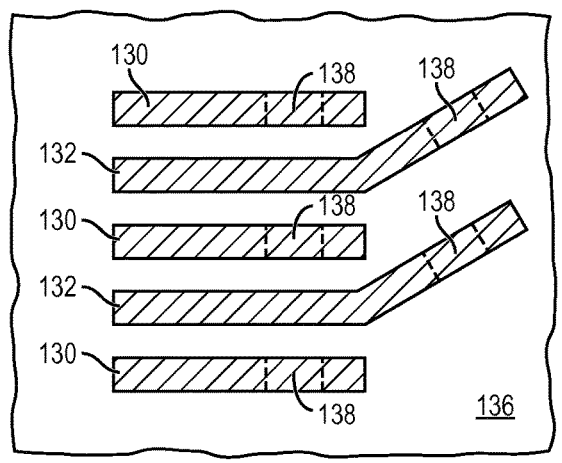
FIGS. 6a-6c illustrate integrated bump pads along the trace lines.
Figure 6B:
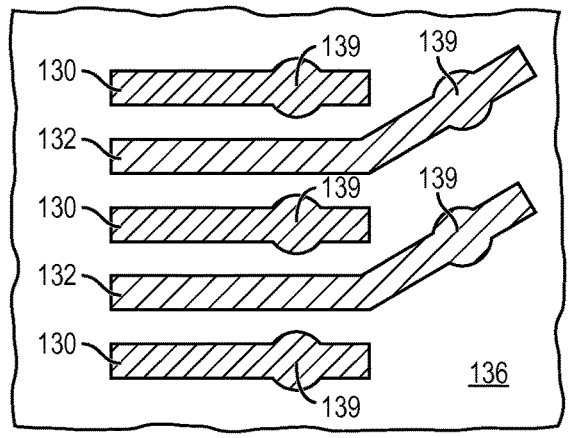
Figure 6C:
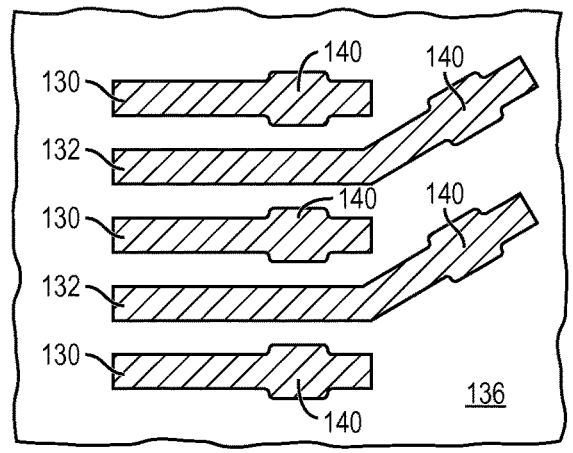

FIG. 5 illustrates a cross-sectional view of a portion of flipchip type semiconductor die 120 with bump pads 122. Trace lines 130 and 132 are formed on substrate 136. Trace lines 130 and 132 are straight electrical conductors with integrated bump pads 138, as shown in FIG. 6a. The integrated bump pads 138 are co-linear with trace lines 130 and 132. Alternatively, trace lines 130 and 132 can have round integrated bump pads 139, as shown in FIG. 6b, or rectangular integrated bump pads 140, as shown in FIG. 6c. The integrated bump pads are typically arranged in an array for maximum interconnect density and capacity.

Figure 2:
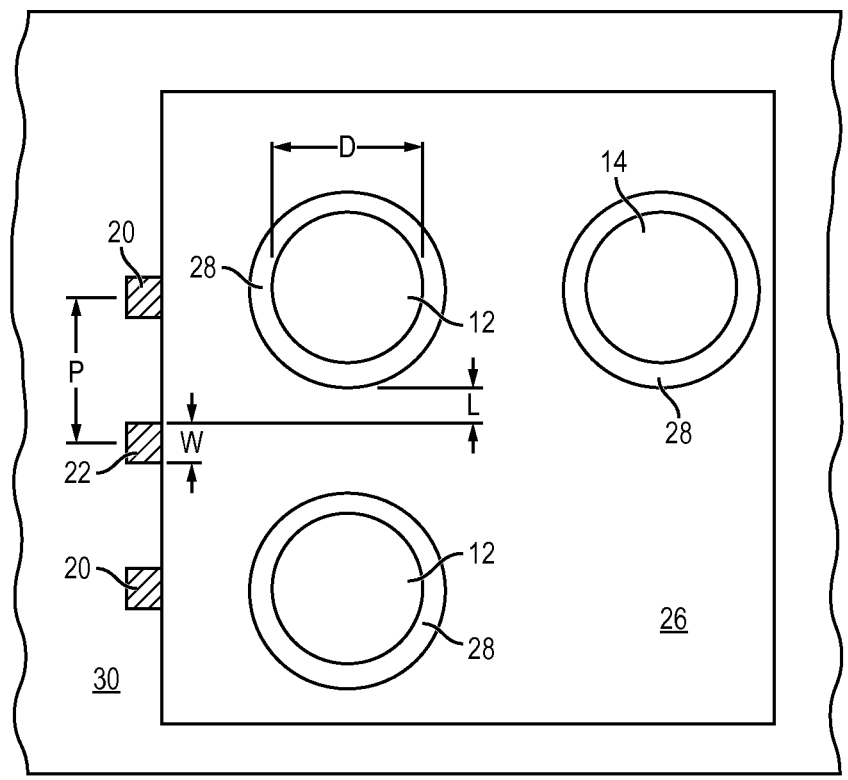
FIG. 2 illustrates a top view of conventional interconnects formed over the trace lines through solder mask openings.
Figure 7:
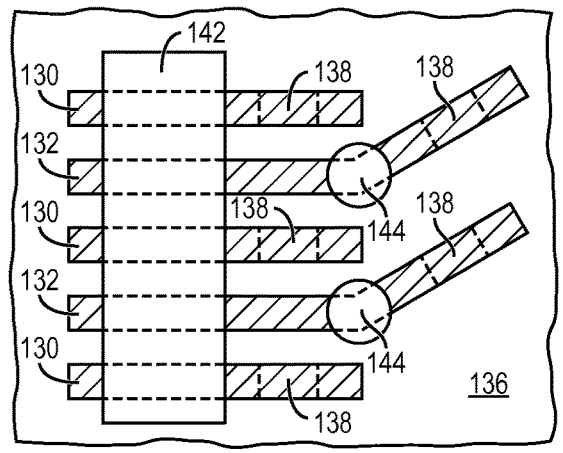
FIG. 7 illustrates a solder mask patch formed interstitially within the array of integrated bump pads on the substrate.
Figure 8:
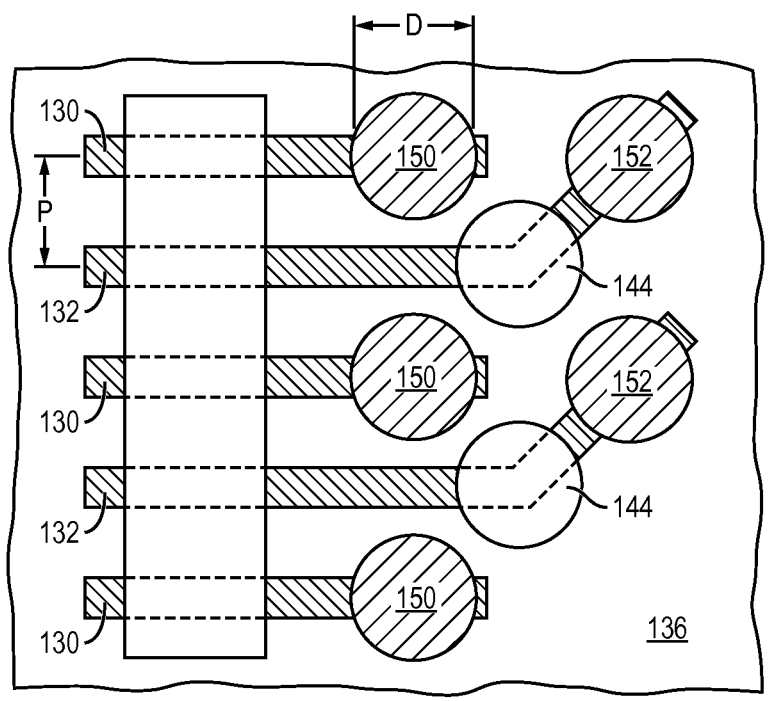
FIG. 8 illustrates bumps formed on the integrated bump pads with bump material confined by the solder mask patch during reflow.

In FIG. 7, solder mask 142 is deposited over a portion of trace lines 130 and 132. However, solder mask 142 is not formed over integrated bump pads 138. Consequently, there is no SRO for each bump pad on the substrate, as found in prior art FIG. 2. A non-wettable solder mask patch 144 is formed on substrate 136 interstitially within the array of integrated bump pads 138, i.e., between adjacent bump pads. The solder mask patch can also be formed on semiconductor die 10 interstitially within the array of die bump pads 122. More generally, the solder mask patch is formed in close proximity to the integrated bump pads in any arrangement to prevent run-out to less wettable areas. FIG. 8 shows bumps 150 and 152 formed over integrated bump pads 138 and confined by solder mask patch 144.

An electrically conductive bump material is deposited over die bump pads 122 or integrated bump pads 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to integrated bump pads 138 using a suitable attachment or bonding process. In one embodiment, the bump material is reflowed by heating the material above its melting point to form spherical balls or bumps 150 and 152. In some applications, bumps 150 and 152 are reflowed a second time to improve electrical contact to die bump pads 122 and integrated bump pads 138. The bumps can also be compression bonded to die bump pads 122 and integrated bump pads 138. Bumps 150 and 152 represent one type of interconnect structure that can be formed over integrated bump pads 138. The interconnect structure can also use stud bump, micro bump, or other electrical interconnect.

In high routing density applications, it is desirable to minimize escape pitch. In order to reduce the pitch between trace lines 130 and 132, the bump material is reflowed without a solder mask around integrated bump pads 138. The escape pitch between trace lines 130 and 132 can be reduced by eliminating the solder mask and associated SROs around the integrated bump pads for solder reflow containment, i.e., by reflowing the bump material without a solder mask. Solder mask 142 may be formed over a portion of trace lines 130 and 132 and substrate 136 away from integrated bump pads 138, as shown in FIG. 7. However, solder mask 142 is not formed over integrated bump pads 138. That is, the portion of trace lines 130 and 132 designed to mate with the bump material is devoid of an SRO formed in solder mask 142.

In addition, solder mask patch 144 is formed on substrate 136 interstitially within the array of integrated bump pads 138. Solder mask patch 144 is non-wettable material. Solder mask patch 144 can be the same material as solder mask 142 and applied during the same processing step, or a different material during a different processing step. Solder mask patch 144 can be formed by selective oxidation, plating, or other treatment of the portion of the trace or pad within the array of integrated bump pads 138. Solder mask patch 144 confines solder flow to integrated bump pads 138 and prevents leaching of conductive bump material to adjacent structures.

When the bump material is reflowed with solder mask patch 144 interstitially disposed within the array of integrated bump pads 138, the wetting and surface tension causes the bump material to be confined and retained within the space between die bump pads 122 and integrated bump pads 138 and portion of substrate 136 immediately adjacent to trace lines 130 and 132 and substantially within the footprint of the integrated bump pads 138.

To achieve the desired confinement property, the bump material can be immersed in a flux solution prior to placement on die bump pad 122 or integrated bump pads 138 to selectively render the region contacted by the bump material more wettable than the surrounding area of trace lines 130 and 132. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, solder mask 142 is not needed around die bump pads 122 or integrated bump pads 138.

Since no SRO is formed around die bump pads 122 or integrated bump pads 138, trace lines 130 and 132 can be formed with a finer pitch, i.e., trace lines 130 and 132 can be disposed closer to adjacent structures without making contact and forming electrical shorts. Assuming the same solder registration design rule, the pitch between trace lines 130 and 132 is given as P=(1.1D+W)/2, where D is the base diameter of bump 150-152 and W is the width of the trace lines 130 and 132. In one embodiment, given a bump diameter of 100 µm and trace line width of 20 µm, the minimum escape pitch of trace lines 130 and 132 is 65 µm. The bump formation eliminates the need to account for the ligament spacing of solder mask material between adjacent openings and minimum resolvable SRO, as found in the prior art.

FIGS. 9-14 describe other embodiments with various interconnect structures applicable to the interconnect structure formed with the solder mask patch, as described in FIGS. 5-8. FIG. 9a shows a semiconductor wafer 220 with a base substrate material 222, such as silicon, germanium, gallium arsenide, indium phosphide, or silicon carbide, for structural support. A plurality of semiconductor die or components 224 is formed on wafer 220 separated by saw streets 226 as described above.

Figure 9A:
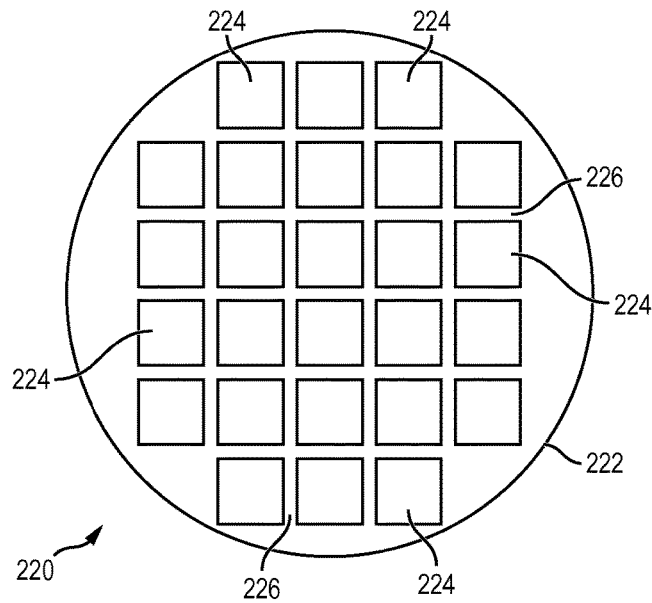
FIGS. 9a-9h illustrate various interconnect structures formed over a semiconductor die for bonding to conductive traces on a substrate.
Figure 9B:
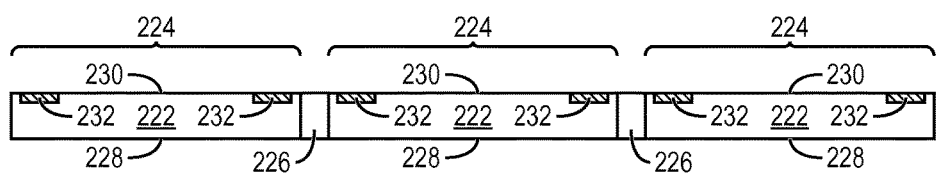

FIG. 9b shows a cross-sectional view of a portion of semiconductor wafer 220. Each semiconductor die 224 has a back surface 228 and active surface 230 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 230 to implement analog circuits or digital circuits, such as digital signal processor (DSP), ASIC, memory, or other signal processing circuit. Semiconductor die 224 may also contain integrated passive devices (IPDs), such as inductors, capacitors, and resistors, for RF signal processing. In one embodiment, semiconductor die 224 is a flipchip type semiconductor die.

An electrically conductive layer 232 is formed over active surface 230 using PVD, CVD, electrolytic plating, electroless plating process, or other suitable metal deposition process. Conductive layer 232 can be one or more layers of Al, Cu, Sn, Ni, Au, Ag, or other suitable electrically conductive material. Conductive layer 232 operates as contact pads or die bumps pads electrically connected to the circuits on active surface 230.

Figure 9C:
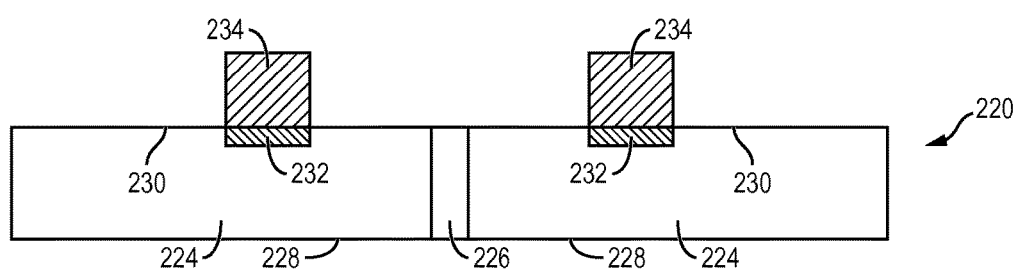
Figure 9D:
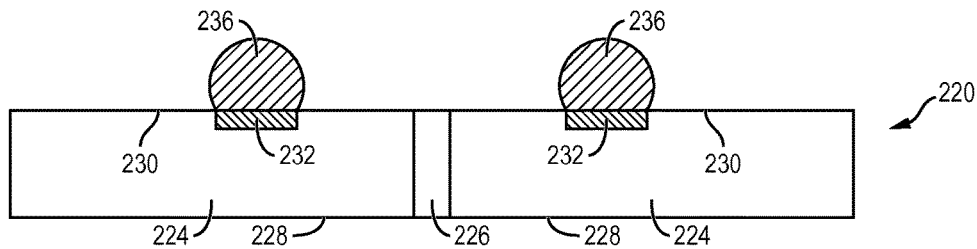

FIG. 9c shows a portion of semiconductor wafer 220 with an interconnect structure formed over contact pads 232. An electrically conductive bump material 234 is deposited over contact pads 232 using an evaporation, electrolytic plating, electroless plating, ball drop, or screen printing process. Bump material 234 can be Al, Sn, Ni, Au, Ag, Pb, Bi, Cu, solder, and combinations thereof, with an optional flux solution. For example, bump material 234 can be eutectic Sn/Pb, high-lead solder, or lead-free solder. Bump material 234 is generally compliant and undergoes plastic deformation greater than about 25 µm under a force equivalent to a vertical load of about 200 grams. Bump material 234 is bonded to contact pad 232 using a suitable attachment or bonding process. For example, bump material 234 can be compression bonded to contact pad 232. Bump material 234 can also be reflowed by heating the material above its melting point to form spherical balls or bumps 236, as shown in FIG. 9d. In some applications, bumps 236 are reflowed a second time to improve electrical connection to contact pad 232. Bumps 236 represent one type of interconnect structure that can be formed over contact pad 232. The interconnect structure can also use stud bump, micro bump, or other electrical interconnect.

Figure 9E:
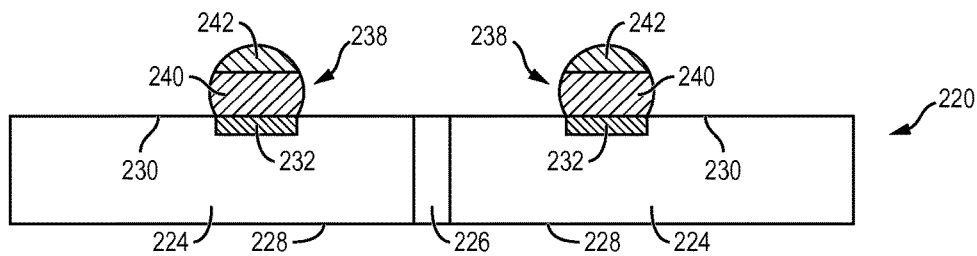

FIG. 9e shows another embodiment of the interconnect structure formed over contact pads 232 as composite bumps 238 including a non-fusible or non-collapsible portion 240 and fusible or collapsible portion 242. The fusible or collapsible and non-fusible or non-collapsible attributes are defined for bumps 238 with respect to reflow conditions. The non-fusible portion 240 can be Au, Cu, Ni, high-lead solder, or lead-tin alloy. The fusible portion 242 can be Sn, lead-free alloy, Sn—Ag alloy, Sn—Ag—Cu alloy, Sn—Ag-indium (In) alloy, eutectic solder, tin alloys with Ag, Cu, or Pb, or other relatively low temperature melt solder. In one embodiment, given a contact pad 232 width or diameter of 100 µm, the non-fusible portion 240 is about 45 µm in height and fusible portion 242 is about 35 µm in height.

Figure 9F:
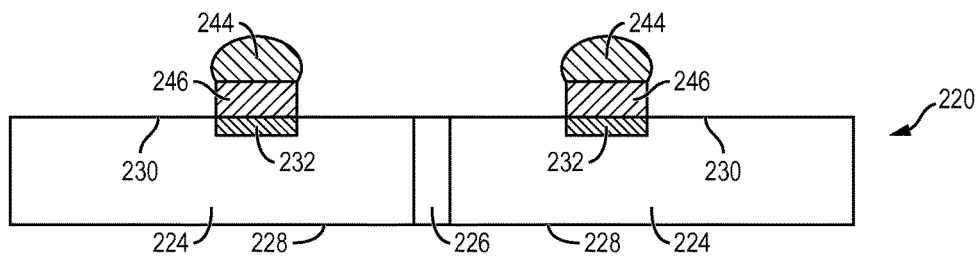

FIG. 9f shows another embodiment of the interconnect structure formed over contact pads 232 as bump 244 over conductive pillar 246. Bump 244 is fusible or collapsible and conductive pillar 246 is non-fusible or non-collapsible. The fusible or collapsible and non-fusible or non-collapsible attributes are defined with respect to reflow conditions. Bump 244 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. Conductive pillar 246 can be Au, Cu, Ni, high-lead solder, or lead-tin alloy. In one embodiment, conductive pillar 246 is a Cu pillar and bump 244 is a solder cap. Given a contact pad 232 width or diameter of 100 µm, conductive pillar 246 is about 45 µm in height and bump 244 is about 35 µm in height.

Figure 9G:
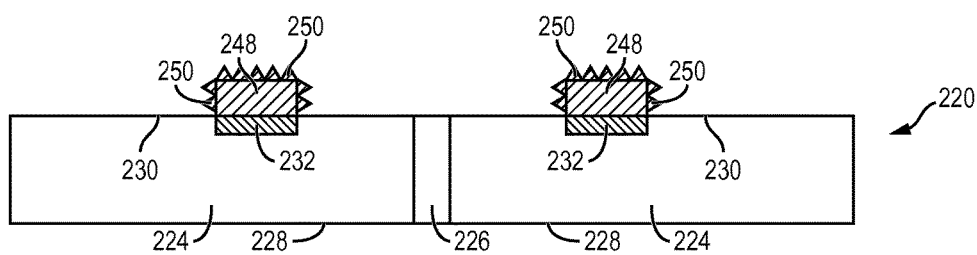

FIG. 9g shows another embodiment of the interconnect structure formed over contact pads 232 as bump material 248 with asperities 250. Bump material 248 is soft and deformable under reflow conditions with a low yield strength and high elongation to failure, similar to bump material 234. Asperities 250 are formed with a plated surface finish and are shown exaggerated in the figures for purposes of illustration. The scale of asperities 250 is generally in the order about 1-25 µm. The asperities can also be formed on bump 236, composite bump 238, and bump 244.

Figure 9H:
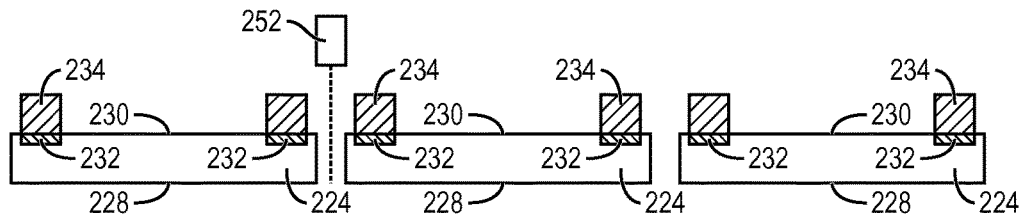

In FIG. 9h, semiconductor wafer 220 is singulated through saw street 226 using a saw blade or laser cutting tool 252 into individual semiconductor die 224.

Figure 10A:
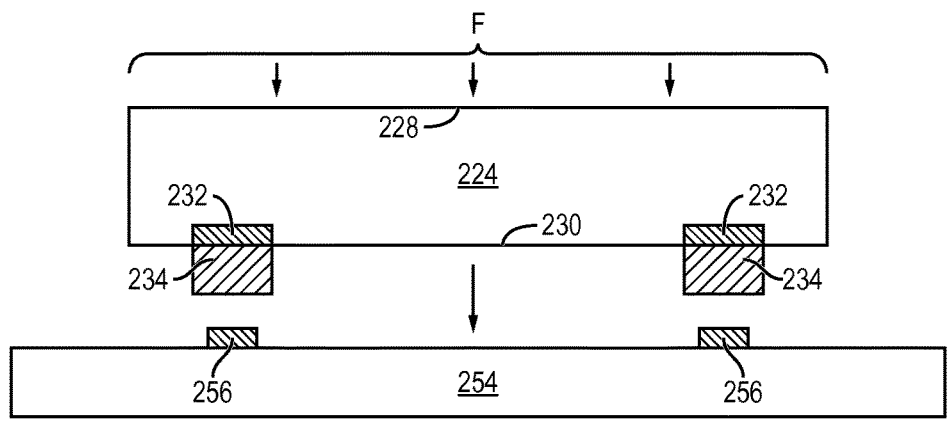
FIGS. 10a-10g illustrate the semiconductor die and interconnect structure bonded to the conductive traces.

FIG. 10a shows a substrate or PCB 254 with conductive trace 256. Substrate 254 can be a single-sided FR5 laminate or 2-sided BT-resin laminate. Semiconductor die 224 is positioned so that bump material 234 is aligned with an interconnect site on conductive trace 256, see FIGS. 6a-6c, 7-8, and 18a-18c. Alternatively, bump material 234 can be aligned with a conductive pad or other interconnect site formed on substrate 254. Bump material 234 is wider than conductive trace 256. In one embodiment, bump material 234 has a width of less than 100 µm and conductive trace or pad 256 has a width of 35 µm for a bump pitch of 150 µm. Conductive traces 256 is applicable to the interconnect structure formed with the solder mask patch, as described in FIGS. 5-8.

Figure 10B:
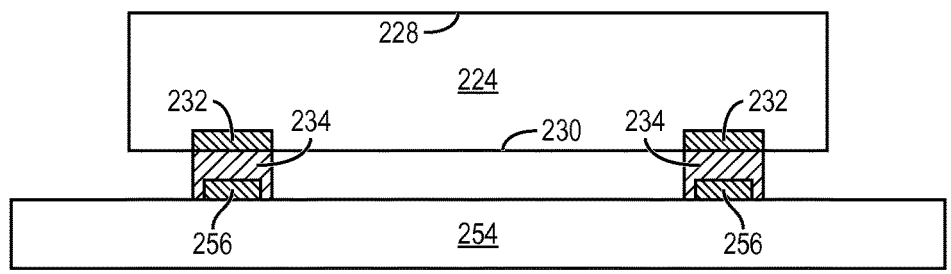

A pressure or force F is applied to back surface 228 of semiconductor die 224 to press bump material 234 onto conductive trace 256. The force F can be applied with an elevated temperature. Due to the compliant nature of bump material 234, the bump material deforms or extrudes around the top surface and side surfaces of conductive trace 256, referred to as BOL. In particular, the application of pressure causes bump material 234 to undergo a plastic deformation greater than about 25 μm under force F equivalent to a vertical load of about 200 grams and cover the top surface and side surfaces of the conductive trace, as shown in FIG. 10b. Bump material 234 can also be metallurgically connected to conductive trace 256 by bringing the bump material in physical contact with the conductive trace and then reflowing the bump material under a reflow temperature.

By making conductive trace 256 narrower than bump material 234, the conductive trace pitch can be reduced to increase routing density and I/O count. The narrower conductive trace 256 reduces the force F needed to deform bump material 234 around the conductive trace. For example, the requisite force F may be 30-50% of the force needed to deform bump material against a conductive trace or pad that is wider than the bump material. The lower compressive force F is useful for fine pitch interconnect and small die to maintain coplanarity with a specified tolerance and achieve uniform z-direction deformation and high reliability interconnect union. In addition, deforming bump material 234 around conductive trace 256 mechanically locks the bump to the trace to prevent die shifting or die floating during reflow.

Figure 10C:
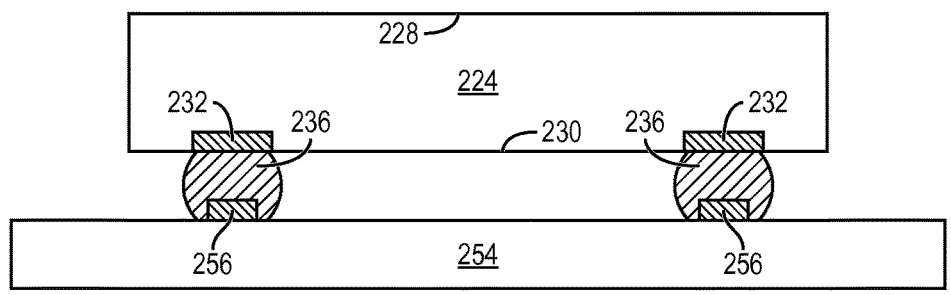

FIG. 10c shows bump 236 formed over contact pad 232 of semiconductor die 224. Semiconductor die 224 is positioned so that bump 236 is aligned with an interconnect site on conductive trace 256. Alternatively, bump 236 can be aligned with a conductive pad or other interconnect site formed on substrate 254. Bump 236 is wider than conductive trace 256. Conductive traces 256 is applicable to the interconnect structure formed with the solder mask patch, as described in FIGS. 5-8.

A pressure or force F is applied to back surface 228 of semiconductor die 224 to press bump 236 onto conductive trace 256. The force F can be applied with an elevated temperature. Due to the compliant nature of bump 236, the bump deforms or extrudes around the top surface and side surfaces of conductive trace 256. In particular, the application of pressure causes bump material 236 to undergo a plastic deformation and cover the top surface and side surfaces of conductive trace 256. Bump 236 can also be metallurgically connected to conductive trace 256 by bringing the bump in physical contact with the conductive trace under reflow temperature.

By making conductive trace 256 narrower than bump 236, the conductive trace pitch can be reduced to increase routing density and I/O count. The narrower conductive trace 256 reduces the force F needed to deform bump 236 around the conductive trace. For example, the requisite force F may be 30-50% of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming bump 236 around conductive trace 256 mechanically locks the bump to the trace to prevent die shifting or die floating during reflow.

Figure 10D:
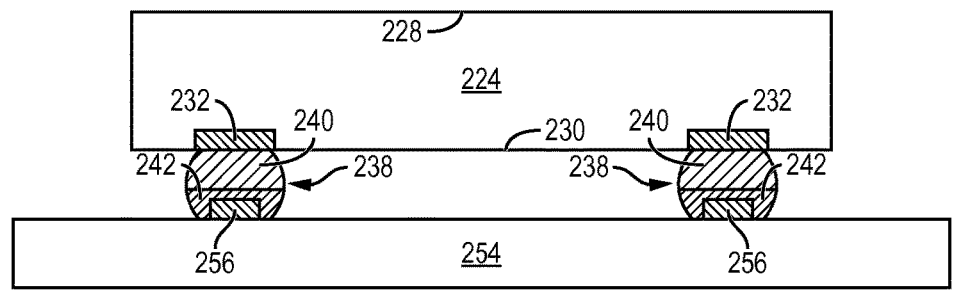

FIG. 10d shows composite bump 238 formed over contact pad 232 of semiconductor die 224. Semiconductor die 224 is positioned so that composite bump 238 is aligned with an interconnect site on conductive trace 256. Alternatively, composite bump 238 can be aligned with a conductive pad or other interconnect site formed on substrate 254. Composite bump 238 is wider than conductive trace 256. Conductive traces 256 is applicable to the interconnect structure formed with the solder mask patch, as described in FIGS. 5-8.

A pressure or force F is applied to back surface 228 of semiconductor die 224 to press fusible portion 242 onto conductive trace 256. The force F can be applied with an elevated temperature. Due to the compliant nature of fusible portion 242, the fusible portion deforms or extrudes around the top surface and side surfaces of conductive trace 256. In particular, the application of pressure causes fusible portion 242 to undergo a plastic deformation and cover the top surface and side surfaces of conductive trace 256. Composite bump 238 can also be metallurgically connected to conductive trace 256 by bringing fusible portion 242 in physical contact with the conductive trace under reflow temperature. The non-fusible portion 240 does not melt or deform during the application of pressure or temperature and retains its height and shape as a vertical standoff between semiconductor die 224 and substrate 254. The additional displacement between semiconductor die 224 and substrate 254 provides greater coplanarity tolerance between the mating surfaces.

The height or volume of fusible bump material in relation to the non-fusible base material is selected to ensure confinement by virtue of surface tension forces. During reflow, the fusible base material is confined around the non-fusible base material due to the solder mask patch. The fusible bump material around the non-fusible base also maintains die placement during reflow. In general the height of the composite interconnect is the same or less than the diameter of the bump.

In some cases, the height of the composite interconnect is greater than the diameter of the interconnect. In one embodiment, given a bump base diameter of 100 μm, the non-fusible base is about 45 μm in height and the fusible cap is about 35 μm in height. The molten bump material remains confined substantially within the area defined by the bump pads due to the solder mask patch and because the volume of bump material deposited to form the composite bump, including non-fusible base and fusible cap, is selected so that the resulting surface tension is sufficient to retain the bump material substantially within the footprint of the bump pads and prevent run-out to unintended adjacent or nearby areas. Hence, the solder mask patch formed interstitially with the array of bump pads reduces trace line pitch and increases routing density.

During a reflow process, a large number (e.g., thousands) of composite bumps 238 on semiconductor die 224 are attached to interconnect sites on conductive trace 256 of substrate 254. Some of the bumps 238 may fail to properly connect to conductive trace 256, particularly if die 224 is warped. Recall that composite bump 238 is wider than conductive trace 256. With a proper force applied, the fusible portion 242 deforms or extrudes around the top surface and side surfaces of conductive trace 256 and mechanically locks composite bump 238 to the conductive trace. The mechanical interlock is formed by nature of the fusible portion 242 being softer and more compliant than conductive trace 256 and therefore deforming over the top surface and around the side surfaces of the conductive trace for greater contact surface area. The mechanical interlock between composite bump 238 and conductive trace 256 holds the bump to the conductive trace during reflow, i.e., the bump and conductive trace do not lose contact. Accordingly, composite bump 238 mating to conductive trace 256 reduces bump interconnect failures.

Figure 10E:
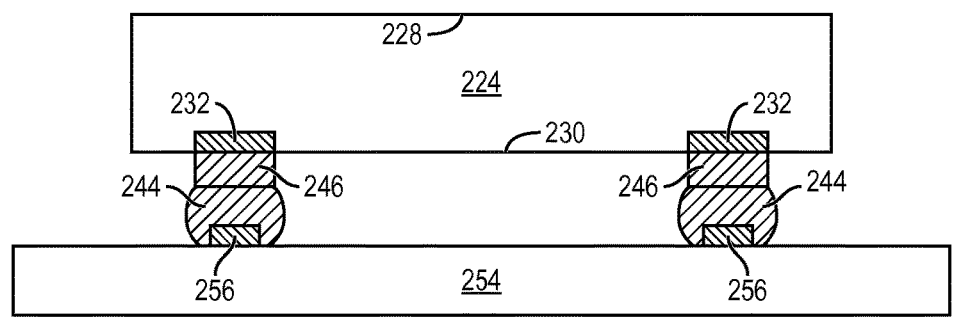

FIG. 10e shows conductive pillar 246 and bump 244 formed over contact pad 232 of semiconductor die 224. Semiconductor die 224 is positioned so that bump 244 is aligned with an interconnect site on conductive trace 256. Alternatively, bump 244 can be aligned with a conductive pad or other interconnect site formed on substrate 254. Bump 244 is wider than conductive trace 256. Conductive traces 256 is applicable to the interconnect structure formed with the solder mask patch, as described in FIGS. 5-8.

A pressure or force F is applied to back surface 228 of semiconductor die 224 to press bump 244 onto conductive trace 256. The force F can be applied with an elevated temperature. Due to the compliant nature of bump 244, the bump deforms or extrudes around the top surface and side surfaces of conductive trace 256. In particular, the application of pressure causes bump 244 to undergo a plastic deformation and cover the top surface and side surfaces of conductive trace 256. Conductive pillar 246 and bump 244 can also be metallurgically connected to conductive trace 256 by bringing the bump in physical contact with the conductive trace under reflow temperature. Conductive pillar 246 does not melt or deform during the application of pressure or temperature and retains its height and shape as a vertical standoff between semiconductor die 224 and substrate 254. The additional displacement between semiconductor die 224 and substrate 254 provides greater coplanarity tolerance between the mating surfaces. The wider bump 244 and narrower conductive trace 256 have similar low requisite compressive force and mechanical locking features and advantages described above for bump material 234 and bump 236.

Figure 10F:
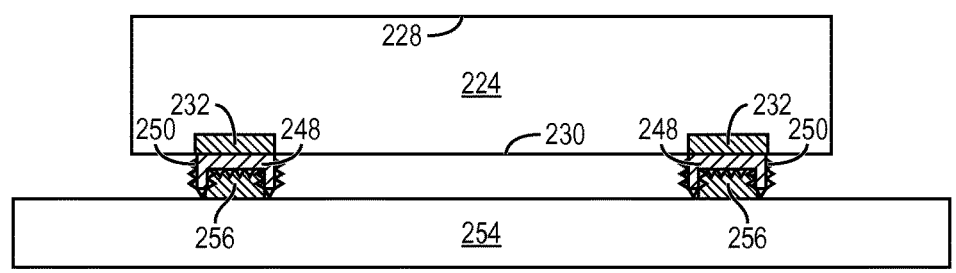

FIG. 10f shows bump material 248 with asperities 250 formed over contact pad 232 of semiconductor die 224. Semiconductor die 224 is positioned so that bump material 248 is aligned with an interconnect site on conductive trace 256. Alternatively, bump material 248 can be aligned with a conductive pad or other interconnect site formed on substrate 254. Bump material 248 is wider than conductive trace 256. A pressure or force F is applied to back surface 228 of semiconductor die 224 to press bump material 248 onto conductive trace 256. The force F can be applied with an elevated temperature. Due to the compliant nature of bump material 248, the bump deforms or extrudes around the top surface and side surfaces of conductive trace 256. In particular, the application of pressure causes bump material 248 to undergo a plastic deformation and cover the top surface and side surfaces of conductive trace 256. In addition, asperities 250 are metallurgically connected to conductive trace 256. Asperities 250 are sized on the order about 1-25 μm.

Figure 10G:
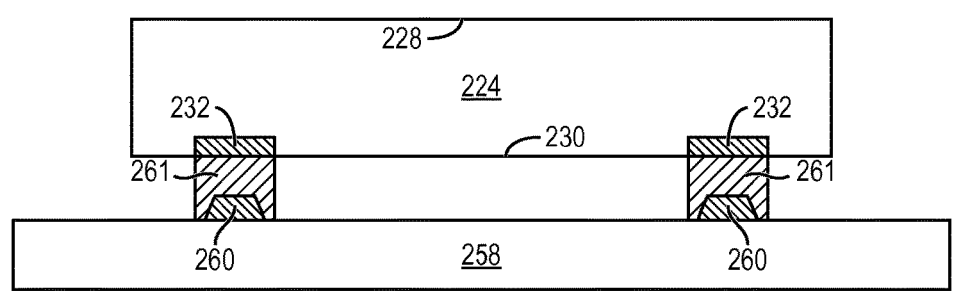

FIG. 10g shows a substrate or PCB 258 with trapezoidal conductive trace 260 having angled or sloped sides. Bump material 261 is formed over contact pad 232 of semiconductor die 224. Semiconductor die 224 is positioned so that bump material 261 is aligned with an interconnect site on conductive trace 260. Alternatively, bump material 261 can be aligned with a conductive pad or other interconnect site formed on substrate 258. Bump material 261 is wider than conductive trace 260. Conductive traces 260 is applicable to the interconnect structure formed with the solder mask patch, as described in FIGS. 5-8.

A pressure or force F is applied to back surface 228 of semiconductor die 224 to press bump material 261 onto conductive trace 260. The force F can be applied with an elevated temperature. Due to the compliant nature of bump material 261, the bump material deforms or extrudes around the top surface and side surfaces of conductive trace 260. In particular, the application of pressure causes bump material 261 to undergo a plastic deformation under force F to cover the top surface and the angled side surfaces of conductive trace 260. Bump material 261 can also be metallurgically connected to conductive trace 260 by bringing the bump material in physical contact with the conductive trace and then reflowing the bump material under a reflow temperature.

FIGS. 11a-11d show a BOL embodiment of semiconductor die 224 and elongated composite bump 262 having a non-fusible or non-collapsible portion 264 and fusible or collapsible portion 266. The non-fusible portion 264 can be Au, Cu, Ni, high-lead solder, or lead-tin alloy. The fusible portion 266 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. The non-fusible portion 264 makes up a larger part of composite bump 262 than the fusible portion 266. The non-fusible portion 264 is fixed to contact pad 232 of semiconductor die 224.

Figure 11A:
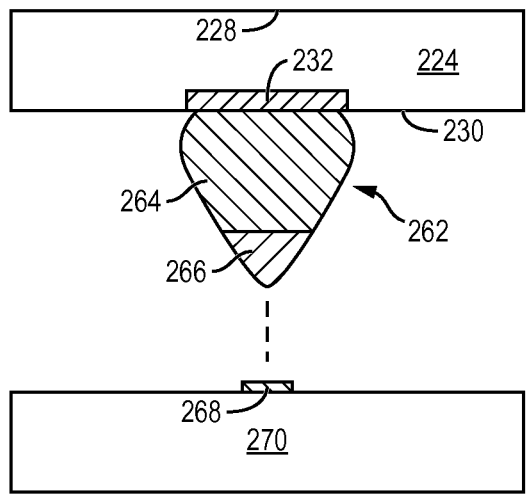
FIGS. 11a-11d illustrate the semiconductor die with a wedge-shaped interconnect structure bonded to the conductive traces.
Figure 11B:
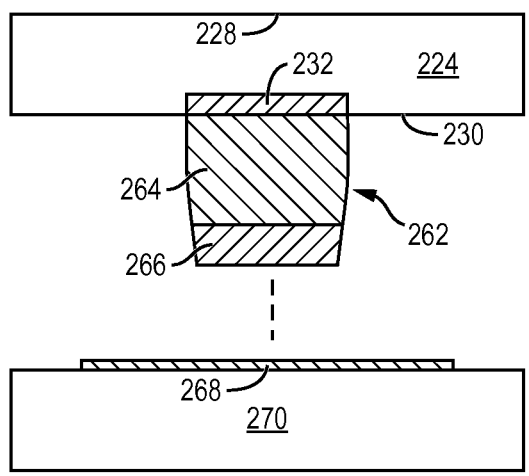
Figure 11C:
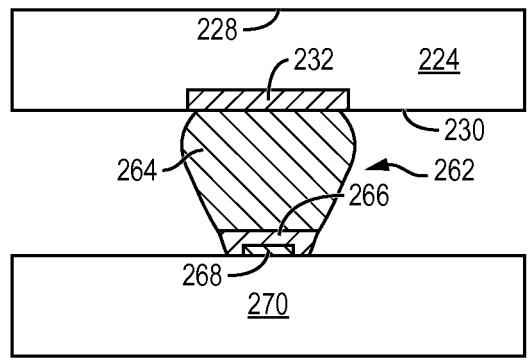
Figure 11D:
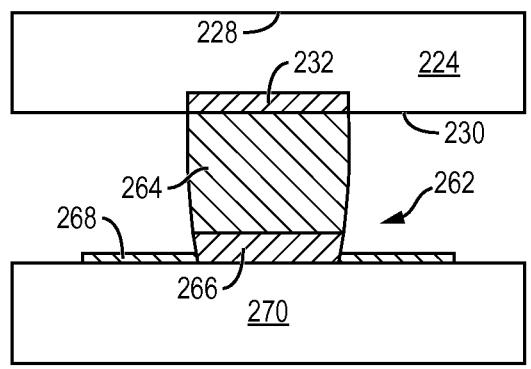

Semiconductor die 224 is positioned so that composite bump 262 is aligned with an interconnect site on conductive trace 268 formed on substrate 270, as shown in FIG. 11a. Composite bump 262 is tapered along conductive trace 268, i.e., the composite bump has a wedge shape, longer along a length of conductive trace 268 and narrower across the conductive trace. The tapered aspect of composite bump 262 occurs along the length of conductive trace 268. The view in FIG. 11a shows the shorter aspect or narrowing taper co-linear with conductive trace 268. The view in FIG. 11b, normal to FIG. 11a, shows the longer aspect of the wedge-shaped composite bump 262. The shorter aspect of composite bump 262 is wider than conductive trace 268. The fusible portion 266 collapses around conductive trace 268 upon application of pressure and/or reflow with heat, as shown in FIGS. 11c and 11d. The non-fusible portion 264 does not melt or deform during reflow and retains its form and shape. The non-fusible portion 264 can be dimensioned to provide a standoff distance between semiconductor die 224 and substrate 270. A finish such as Cu OSP can be applied to substrate 270. Conductive traces 268 is applicable to the interconnect structure formed with the solder mask patch, as described in FIGS. 5-8.

During a reflow process, a large number (e.g., thousands) of composite bumps 262 on semiconductor die 224 are attached to interconnect sites on conductive trace 268 of substrate 270. Some of the bumps 262 may fail to properly connect to conductive trace 268, particularly if semiconductor die 224 is warped. Recall that composite bump 262 is wider than conductive trace 268. With a proper force applied, the fusible portion 266 deforms or extrudes around the top surface and side surfaces of conductive trace 268 and mechanically locks composite bump 262 to the conductive trace. The mechanical interlock is formed by nature of the fusible portion 266 being softer and more compliant than conductive trace 268 and therefore deforming around the top surface and side surfaces of the conductive trace for greater contact area. The wedge-shape of composite bump 262 increases contact area between the bump and conductive trace, e.g., along the longer aspect of FIGS. 11b and 11d, without sacrificing pitch along the shorter aspect of FIGS. 11a and 11c. The mechanical interlock between composite bump 262 and conductive trace 268 holds the bump to the conductive trace during reflow, i.e., the bump and conductive trace do not lose contact. Accordingly, composite bump 262 mating to conductive trace 268 reduces bump interconnect failures.

Figure 12A:
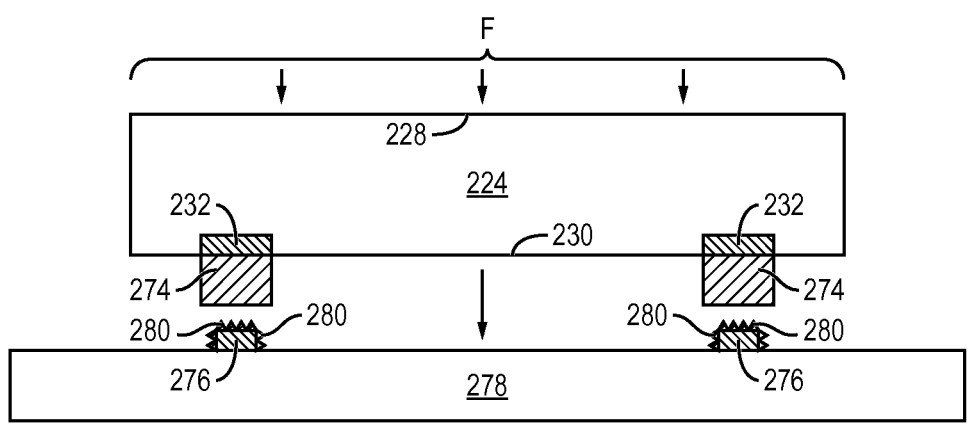
FIGS. 12a-12d illustrate another embodiment of the semiconductor die and interconnect structure bonded to the conductive traces.

FIGS. 12a-12d show a BOL embodiment of semiconductor die 224 with bump material 274 formed over contact pads 232, similar to FIG. 9c. In FIG. 12a, bump material 274 is generally compliant and undergoes plastic deformation greater than about 25 μm under a force equivalent to a vertical load of about 200 grams. Bump material 274 is wider than conductive trace 276 on substrate 278. A plurality of asperities 280 is formed on conductive trace 276 with a height on the order about 1-25 μm.

Figure 12B:
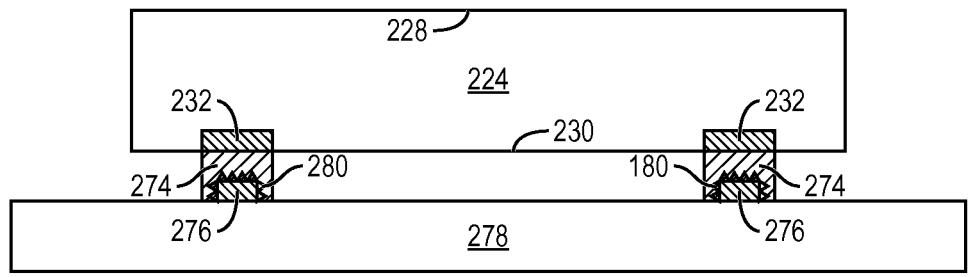

Semiconductor die 224 is positioned so that bump material 274 is aligned with an interconnect site on conductive trace 276. Alternatively, bump material 274 can be aligned with a conductive pad or other interconnect site formed on substrate 278. A pressure or force F is applied to back surface 228 of semiconductor die 224 to press bump material 274 onto conductive trace 276 and asperities 280, as shown in FIG. 12b. The force F can be applied with an elevated temperature. Due to the compliant nature of bump material 274, the bump material deforms or extrudes around the top surface and side surfaces of conductive trace 276 and asperities 280. In particular, the application of pressure causes bump material 274 to undergo a plastic deformation and cover the top surface and side surfaces of conductive trace 276 and asperities 280. The plastic flow of bump material 274 creates macroscopic mechanical interlocking points between the bump material and the top surface and side surfaces of conductive trace 276 and asperities 280. The plastic flow of bump material 274 occurs around the top surface and side surfaces of conductive trace 276 and asperities 280, but does not extend excessively onto substrate 278, which could cause electrical shorting and other defects. The mechanical interlock between the bump material and the top surface and side surfaces of conductive trace 276 and asperities 280 provides a robust connection with greater contact area between the respective surfaces, without significantly increasing the bonding force. The mechanical interlock between the bump material and the top surface and side surfaces of conductive trace 276 and asperities 280 also reduces lateral die shifting during subsequent manufacturing processes, such as encapsulation.

Figure 12C:
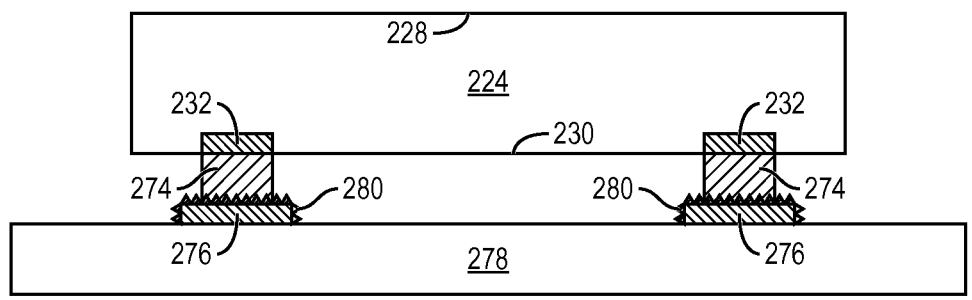

FIG. 12c shows another BOL embodiment with bump material 274 narrower than conductive trace 276. A pressure or force F is applied to back surface 228 of semiconductor die 224 to press bump material 274 onto conductive trace 276 and asperities 280. The force F can be applied with an elevated temperature. Due to the compliant nature of bump material 274, the bump material deforms or extrudes over the top surface of conductive trace 276 and asperities 280. In particular, the application of pressure causes bump material 274 to undergo a plastic deformation and cover the top surface of conductive trace 276 and asperities 280. The plastic flow of bump material 274 creates macroscopic mechanical interlocking points between the bump material and the top surface of conductive trace 276 and asperities 280. The mechanical interlock between the bump material and the top surface of conductive trace 276 and asperities 280 provides a robust connection with greater contact area between the respective surfaces, without significantly increasing the bonding force. The mechanical interlock between the bump material and the top surface of conductive trace 276 and asperities 280 also reduces lateral die shifting during subsequent manufacturing processes, such as encapsulation.

Figure 12D:
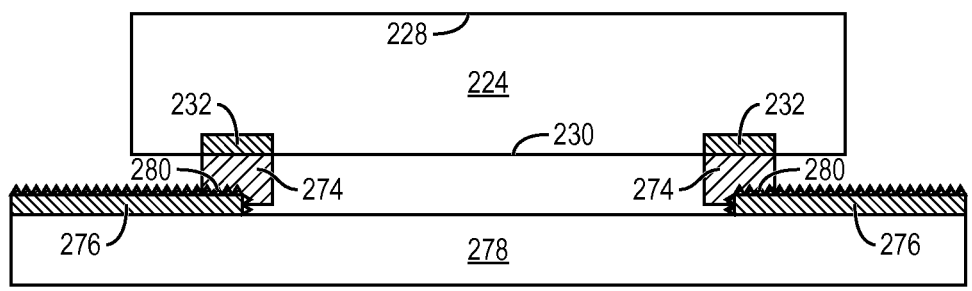

FIG. 12d shows another BOL embodiment with bump material 274 formed over an edge of conductive trace 276, i.e., part of the bump material is over the conductive trace and part of the bump material is not over the conductive trace. A pressure or force F is applied to back surface 228 of semiconductor die 224 to press bump material 274 onto conductive trace 276 and asperities 280. The force F can be applied with an elevated temperature. Due to the compliant nature of bump material 274, the bump material deforms or extrudes over the top surface and side surfaces of conductive trace 276 and asperities 280. In particular, the application of pressure causes bump material 274 to undergo a plastic deformation and cover the top surface and side surfaces of conductive trace 276 and asperities 280. The plastic flow of bump material 274 creates macroscopic mechanical interlocking between the bump material and the top surface and side surfaces of conductive trace 276 and asperities 280. The mechanical interlock between the bump material and the top surface and side surfaces of conductive trace 276 and asperities 280 provides a robust connection with greater contact area between the respective surfaces, without significantly increasing the bonding force. The mechanical interlock between the bump material and the top surface and side surfaces of conductive trace 276 and asperities 280 also reduces lateral die shifting during subsequent manufacturing processes, such as encapsulation.

Figure 13A:
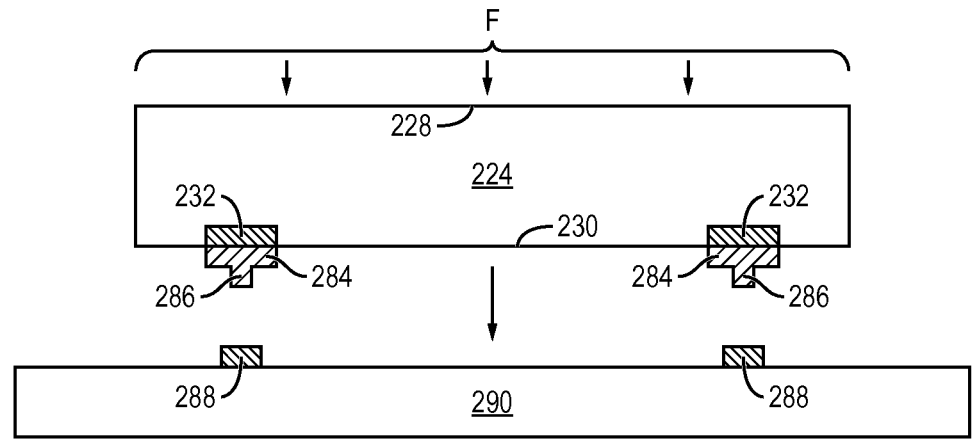
FIGS. 13a-13c illustrate stepped bump and stud bump interconnect structures bonded to the conductive traces.
Figure 13B:
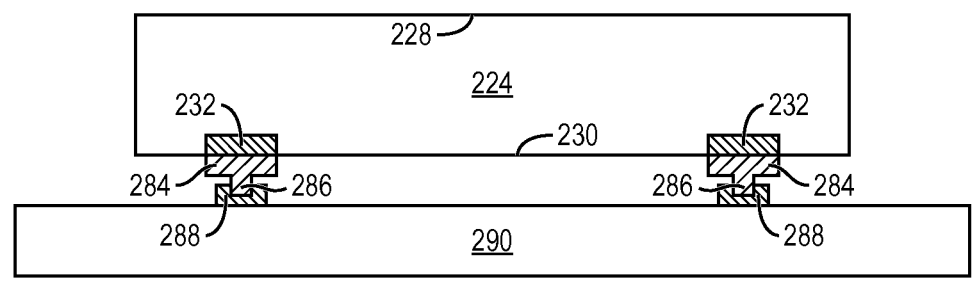
Figure 13C:
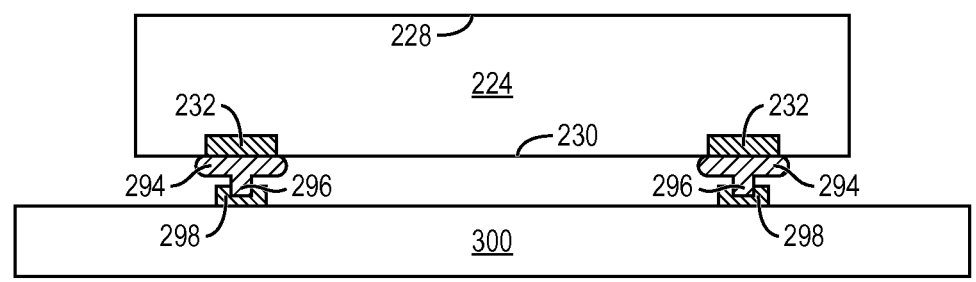

FIGS. 13a-13c show a BOL embodiment of semiconductor die 224 with bump material 284 formed over contact pads 232, similar to FIG. 9c. A tip 286 extends from the body of bump material 284 as a stepped bump with tip 286 narrower than the body of bump material 284, as shown in FIG. 13a. Semiconductor die 224 is positioned so that bump material 284 is aligned with an interconnect site on conductive trace 288 on substrate 290. More specifically, tip 286 is centered over an interconnect site on conductive trace 288. Alternatively, bump material 284 and tip 286 can be aligned with a conductive pad or other interconnect site formed on substrate 290. Bump material 284 is wider than conductive trace 288 on substrate 290.

Conductive trace 288 is generally compliant and undergoes plastic deformation greater than about 25 μm under a force equivalent to a vertical load of about 200 grams. A pressure or force F is applied to back surface 228 of semiconductor die 224 to press tip 284 onto conductive trace 288. The force F can be applied with an elevated temperature. Due to the compliant nature of conductive trace 288, the conductive trace deforms around tip 286, as shown in FIG. 13b. In particular, the application of pressure causes conductive trace 288 to undergo a plastic deformation and cover the top surface and side surfaces of tip 286.

FIG. 13c shows another BOL embodiment with rounded bump material 294 formed over contact pads 232. A tip 296 extends from the body of bump material 294 to form a stud bump with the tip narrower than the body of bump material 294. Semiconductor die 224 is positioned so that bump material 294 is aligned with an interconnect site on conductive trace 298 on substrate 300. More specifically, tip 296 is centered over an interconnect site on conductive trace 298. Alternatively, bump material 294 and tip 296 can be aligned with a conductive pad or other interconnect site formed on substrate 300. Bump material 294 is wider than conductive trace 298 on substrate 300.

Conductive trace 298 is generally compliant and undergoes plastic deformation greater than about 25 μm under a force equivalent to a vertical load of about 200 grams. A pressure or force F is applied to back surface 228 of semiconductor die 224 to press tip 296 onto conductive trace 298. The force F can be applied with an elevated temperature. Due to the compliant nature of conductive trace 298, the conductive trace deforms around tip 296. In particular, the application of pressure causes conductive trace 298 to undergo a plastic deformation and cover the top surface and side surfaces of tip 296.

The conductive traces described in FIGS. 10a-10g, 11a-11d, and 12a-12d can also be compliant material as described in FIGS. 13a-13c.

Figure 14A:
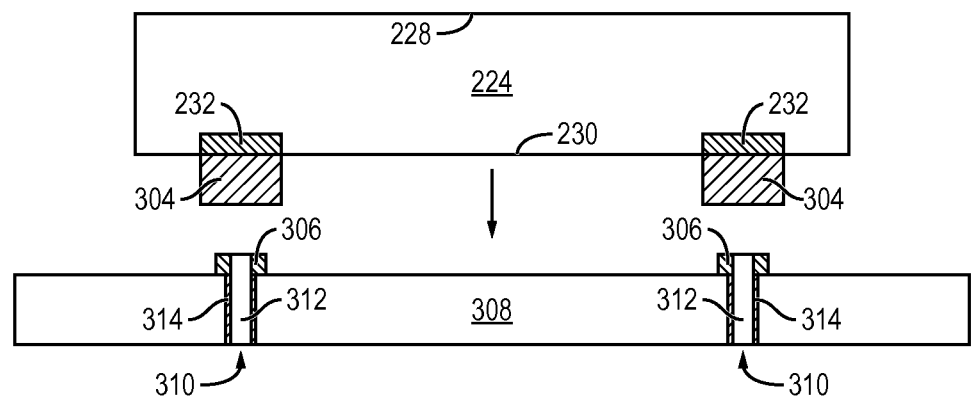
FIGS. 14a-14b illustrate conductive traces with conductive vias.
Figure 14B:
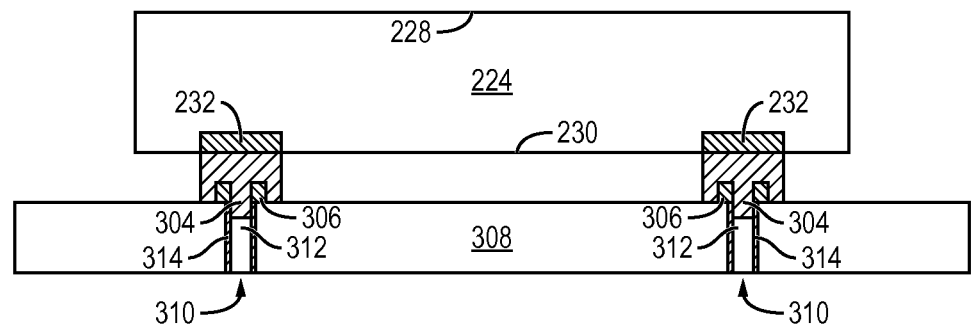

FIGS. 14a-14b show a BOL embodiment of semiconductor die 224 with bump material 304 formed over contact pads 232, similar to FIG. 9c. Bump material 304 is generally compliant and undergoes plastic deformation greater than about 25 μm under a force equivalent to a vertical load of about 200 grams. Bump material 304 is wider than conductive trace 306 on substrate 308. A conductive via 310 is formed through conductive trace 306 with an opening 312 and conductive sidewalls 314, as shown in FIG. 14a. Conductive traces 306 is applicable to the interconnect structure formed with the solder mask patch, as described in FIGS. 5-8.

Semiconductor die 224 is positioned so that bump material 304 is aligned with an interconnect site on conductive trace 306, see FIGS. 6a-6c, 7-8, and 18a-18c. Alternatively, bump material 304 can be aligned with a conductive pad or other interconnect site formed on substrate 308. A pressure or force F is applied to back surface 228 of semiconductor die 224 to press bump material 304 onto conductive trace 306 and into opening 312 of conductive via 310. The force F can be applied with an elevated temperature. Due to the compliant nature of bump material 304, the bump material deforms or extrudes around the top surface and side surfaces of conductive trace 306 and into opening 312 of conductive vias 310, as shown in FIG. 14b. In particular, the application of pressure causes bump material 304 to undergo a plastic deformation and cover the top surface and side surfaces of conductive trace 306 and into opening 312 of conductive via 310. Bump material 304 is thus electrically connected to conductive trace 306 and conductive sidewalls 314 for z-direction vertical interconnect through substrate 308. The plastic flow of bump material 304 creates a mechanical interlock between the bump material and the top surface and side surfaces of conductive trace 306 and opening 312 of conductive via 310. The mechanical interlock between the bump material and the top surface and side surfaces of conductive trace 306 and opening 312 of conductive via 310 provides a robust connection with greater contact area between the respective surfaces, without significantly increasing the bonding force. The mechanical interlock between the bump material and the top surface and side surfaces of conductive trace 306 and opening 312 of conductive via 310 also reduces lateral die shifting during subsequent manufacturing processes, such as encapsulation. Since conductive via 310 is formed within the interconnect site with bump material 304, the total substrate interconnect area is reduced.

In the BOL embodiments of FIGS. 10a-10g, 11a-11d, 12a-12d, 13a-13c, and 14a-14b, by making the conductive trace narrower than the interconnect structure, the conductive trace pitch can be reduced to increase routing density and I/O count. The narrower conductive trace reduces the force F needed to deform the interconnect structure around the conductive trace. For example, the requisite force F may be 30-50% of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming the interconnect structure around the conductive trace mechanically locks the bump to the trace to prevent die shifting or die floating during reflow.

Figure 15C:
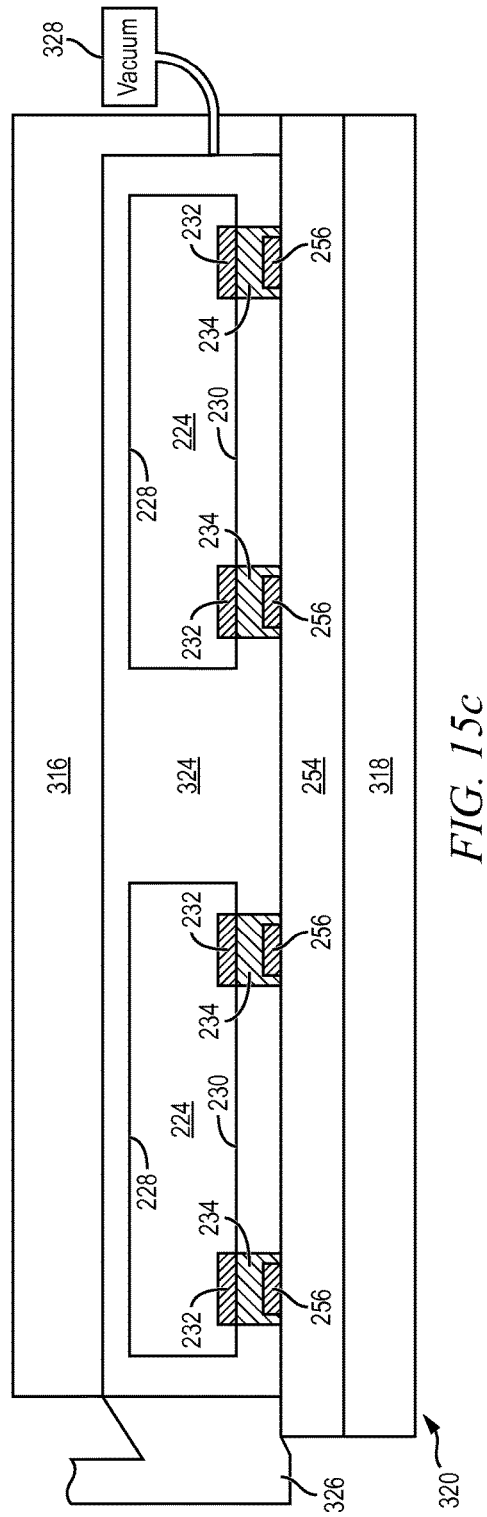

FIGS. 15a-15c show a mold underfill (MUF) process to deposit encapsulant around the bumps between the semiconductor die and substrate. FIG. 15a shows semiconductor die 224 mounted to substrate 254 using bump material 234 from FIG. 10b and placed between upper mold support 316 and lower mold support 318 of chase mold 320. The other semiconductor die and substrate combinations from FIGS. 10a-10g, 11a-11d, 12a-12d, 13a-13c, and 14a-14b can be placed between upper mold support 316 and lower mold support 318 of chase mold 320. The upper mold support 316 includes compressible releasing film 322.

In FIG. 15b, upper mold support 316 and lower mold support 318 are brought together to enclose semiconductor die 224 and substrate 254 with an open space over the substrate and between the semiconductor die and substrate. Compressible releasing film 322 conforms to back surface 228 and side surfaces of semiconductor die 224 to block formation of encapsulant on these surfaces. An encapsulant 324 in a liquid state is injected into one side of chase mold 320 with nozzle 326 while an optional vacuum assist 328 draws pressure from the opposite side to uniformly fill the open space over substrate 254 and the open space between semiconductor die 224 and substrate 254 with the encapsulant. Encapsulant 324 can be polymer composite material, such as epoxy resin with filler, epoxy acrylate with filler, or polymer with proper filler. Encapsulant 324 is non-conductive and environmentally protects the semiconductor device from external elements and contaminants. Compressible material 322 prevents encapsulant 324 from flowing over back surface 228 and around the side surfaces of semiconductor die 224. Encapsulant 324 is cured. The back surface 228 and side surfaces of semiconductor die 224 remain exposed from encapsulant 324.

FIG. 15c shows an embodiment of MUF and mold overfill (MOF), i.e., without compressible material 322. Semiconductor die 224 and substrate 254 are placed between upper mold support 316 and lower mold support 318 of chase mold 320. The upper mold support 316 and lower mold support 318 are brought together to enclose semiconductor die 224 and substrate 254 with an open space over the substrate, around the semiconductor die, and between the semiconductor die and substrate. Encapsulant 324 in a liquid state is injected into one side of chase mold 320 with nozzle 326 while an optional vacuum assist 328 draws pressure from the opposite side to uniformly fill the open space around semiconductor die 224 and over substrate 254 and the open space between semiconductor die 224 and substrate 254 with the encapsulant. Encapsulant 324 is cured.

Figure 16:
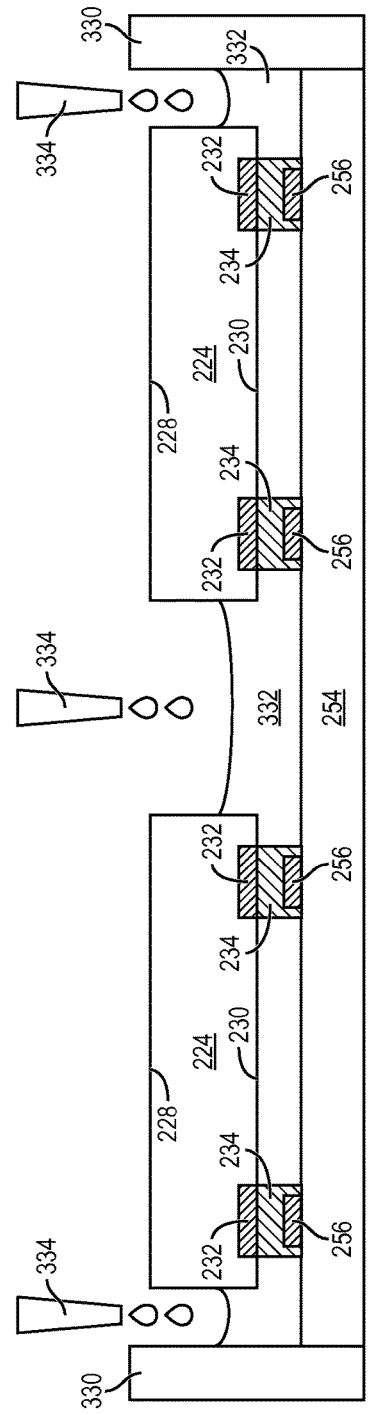
FIG. 16 illustrates another mold underfill between the semiconductor die and substrate.

FIG. 16 shows another embodiment of depositing encapsulant around semiconductor die 224 and in the gap between semiconductor die 224 and substrate 254. Semiconductor die 224 and substrate 254 are enclosed by dam 330. Encapsulant 332 is dispensed from nozzles 334 in a liquid state into dam 330 to fill the open space over substrate 254 and the open space between semiconductor die 224 and substrate 254. The volume of encapsulant 332 dispensed from nozzles 334 is controlled to fill dam 330 without covering back surface 228 or the side surfaces of semiconductor die 224. Encapsulant 332 is cured.

Figure 17:
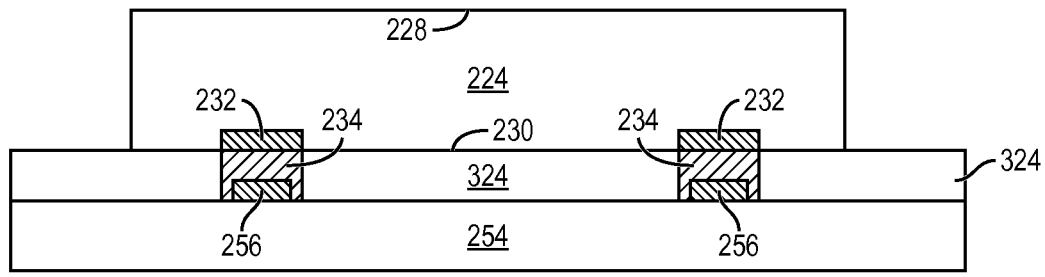
FIG. 17 illustrates the semiconductor die and substrate after mold underfill.

FIG. 17 shows semiconductor die 224 and substrate 254 after the MUF process from FIGS. 16a, 16c, and 17. Encapsulant 324 is uniformly distributed over substrate 254 and around bump material 234 between semiconductor die 224 and substrate 254.

Figure 18A:
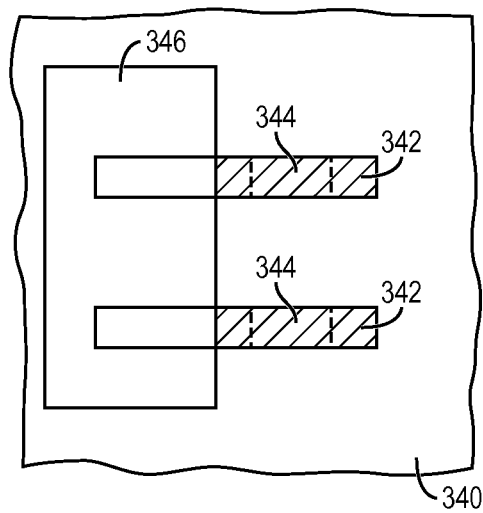
FIGS. 18a-18c illustrate various arrangements of the conductive traces with open solder registration.
Figure 18B:
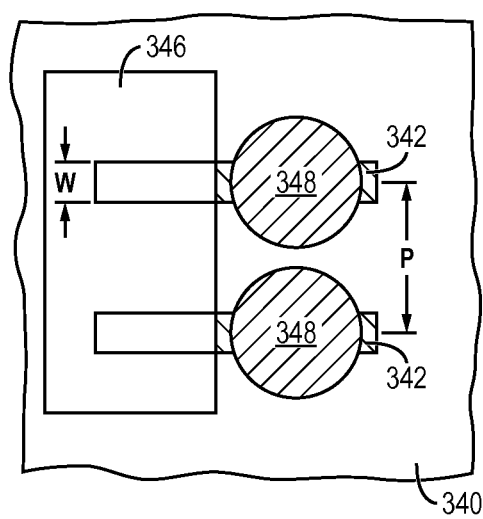
Figure 18C:
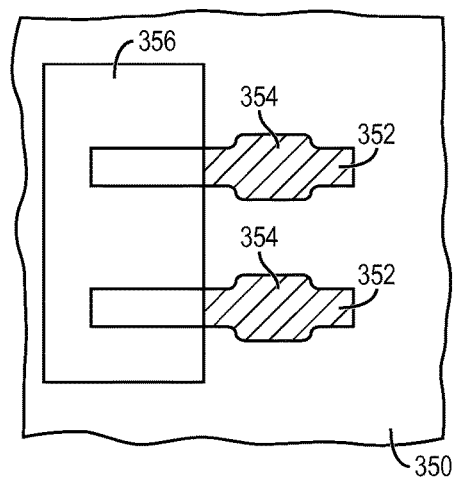

FIGS. 18a-18c show top views of various conductive trace layouts on substrate or PCB 340. In FIG. 18a, conductive trace 342 is a straight conductor with integrated bump pad or interconnect site 344 formed on substrate 340. The sides of substrate bump pad 344 can be co-linear with conductive trace 342. In the prior art, SRO is typically formed over the interconnect site to contain the bump material during reflow. The SRO increases interconnect pitch and reduces I/O count. In contrast, masking layer 346 can be formed over a portion of substrate 340; however, the masking layer is not formed around substrate bump pad 344 of conductive trace 342. That is, the portion of conductive trace 342 designed to mate with the bump material is devoid of any SRO of masking layer 346 that would have been used for bump containment during reflow.

Semiconductor die 224 is placed over substrate 340 and the bump material is aligned with substrate bump pads 344. The bump material is electrically and metallurgically connected to substrate bump pads 344 by bringing the bump material in physical contact with the bump pad and then reflowing the bump material under a reflow temperature.

In another embodiment, an electrically conductive bump material is deposited over substrate bump pad 344 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 344 using a suitable attachment or bonding process. In one embodiment, the bump material is reflowed by heating the material above its melting point to form bump or interconnect 348, as shown in FIG. 18b. In some applications, bump 348 is reflowed a second time to improve electrical contact to substrate bump pad 344. The bump material around the narrow substrate bump pad 344 maintains die placement during reflow.

In high routing density applications, it is desirable to minimize escape pitch of conductive traces 342. The escape pitch between conductive traces 342 can be reduced by eliminating the masking layer for the purpose of reflow containment, i.e., by reflowing the bump material without a masking layer. Since no SRO is formed around die bump pad 232 or substrate bump pad 344, conductive traces 342 can be formed with a finer pitch, i.e., conductive trace 342 can be disposed closer together or to nearby structures. With no SRO around substrate bump pad 344, the pitch between conductive traces 342 is given as P=D+PLT+W/2, wherein D is the base diameter of bump 348, PLT is die placement tolerance, and W is the width of conductive trace 342. In one embodiment, given a bump base diameter of 100 μm, PLT of 10 μm, and trace line width of 30 μm, the minimum escape pitch of conductive trace 342 is 125 μm. The maskless bump formation eliminates the need to account for the ligament spacing of masking material between adjacent openings, solder mask registration tolerance (SRT), and minimum resolvable SRO, as found in the prior art.

When the bump material is reflowed without a masking layer to metallurgically and electrically connect die bump pad 232 to substrate bump pad 344, the wetting and surface tension causes the bump material to maintain self-confinement and be retained within the space between die bump pad 232 and substrate bump pad 344 and portion of substrate 340 immediately adjacent to conductive trace 342 substantially within the footprint of the bump pads.

To achieve the desired self-confinement property, the bump material can be immersed in a flux solution prior to placement on die bump pad 232 or substrate bump pad 344 to selectively render the region contacted by the bump material more wettable than the surrounding area of conductive traces 342. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 340 is not needed around die bump pad 232 or substrate bump pad 344.

FIG. 18c shows another embodiment of parallel conductive traces 352 as a straight conductor with integrated rectangular bump pad or interconnect site 354 formed on substrate 350. In this case, substrate bump pad 354 is wider than conductive trace 352, but less than the width of the mating bump. The sides of substrate bump pad 354 can be parallel to conductive trace 352. Masking layer 356 can be formed over a portion of substrate 350; however, the masking layer is not formed around substrate bump pad 354 of conductive trace 352. That is, the portion of conductive trace 352 designed to mate with the bump material is devoid of any SRO of masking layer 356 that would have been used for bump containment during reflow.

Figure 19:
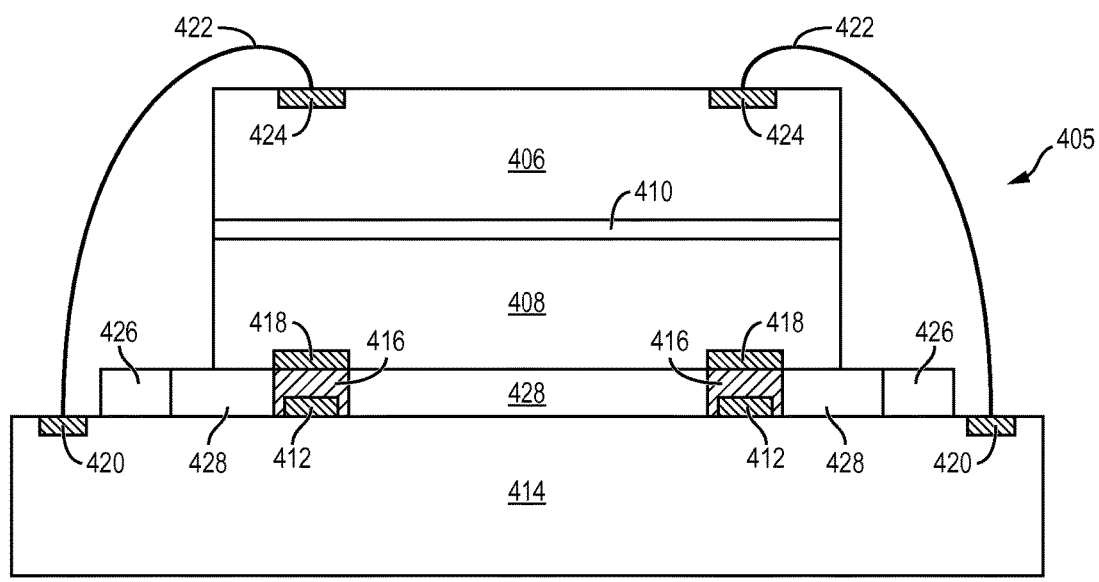
FIG. 19 illustrates a POP with masking layer dam to restrain the encapsulant during mold underfill.

FIG. 19 shows package-on-package (PoP) 405 with semiconductor die 406 stacked over semiconductor die 408 using die attach adhesive 410. Semiconductor die 406 and 408 each have an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 406 and 408 may also contain IPDs, such as inductors, capacitors, and resistors, for RF signal processing.

Semiconductor die 408 is mounted to conductive traces 412 formed on substrate 414 using bump material 416 formed on contact pads 418, using any of the embodiments from FIGS. 10a-10g, 11a-11d, 12a-12d, 13a-13c, and 14a-14b. Conductive traces 412 is applicable to the interconnect structure formed with the solder mask patch, as described in FIGS. 5-8. Semiconductor die 406 is electrically connected to contact pads 420 formed on substrate 414 using bond wires 422. The opposite end of bond wire 422 is bonded to contact pads 424 on semiconductor die 406.

Masking layer 426 is formed over substrate 414 and opened beyond the footprint of semiconductor die 406. While masking layer 426 does not confine bump material 416 to conductive traces 412 during reflow, the open mask can operate as a dam to prevent encapsulant 428 from migrating to contact pads 420 or bond wires 422 during MUF. Encapsulant 428 is deposited between semiconductor die 408 and substrate 414, similar to FIGS. 15a-15c. Masking layer 426 blocks MUF encapsulant 428 from reaching contact pads 420 and bond wires 422, which could cause a defect. Masking layer 426 allows a larger semiconductor die to be placed on a given substrate without risk of encapsulant 428 bleeding onto contact pads 420.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate including an array of first interconnect sites;
   providing a semiconductor die including an array of second interconnect sites;
   forming a plurality of physically separate solder mask patches disposed interstitially between and physically isolated from each of the array of first interconnect sites or the array of second interconnect sites; and
   forming an interconnect structure between the first and second interconnect sites, wherein the solder mask patches confine the interconnect structure over the first interconnect sites and second interconnect sites.

2. The method of claim 1, wherein the solder mask patches include non-wettable material.

3. The method of claim 1, wherein the interconnect structure includes a fusible portion and non-fusible portion.

4. A method of making a semiconductor device, comprising:
   providing a substrate including an array of first interconnect sites;
   forming a plurality of physically separate solder mask patches disposed interstitially between and physically isolated from each of the array of first interconnect sites; and
   forming an interconnect structure over the first interconnect sites and confined around each of the array of first interconnect sites by the solder mask patches.

5. The method of claim 4, wherein the solder mask patches include non-wettable material.

6. The method of claim 4, further including disposing a semiconductor die over the substrate, the semiconductor die including an array of second interconnect sites disposed over the array of first interconnect sites.

7. The method of claim 6, wherein forming the interconnect structure includes depositing a volume of conductive bump material between the first interconnect sites and second interconnect sites so that a surface tension maintains confinement of the volume of conductive bump material over the first interconnect sites or second interconnect sites.

8. The method of claim 4, wherein the interconnect structure includes a fusible portion and non-fusible portion.

9. A method of making a semiconductor device, comprising:
   providing a substrate including a first interconnect site and a second interconnect site;
   forming a first physically separate solder mask patch over the substrate disposed interstitially between the first interconnect site and second interconnect site; and
   forming an interconnect structure over the first interconnect site, wherein the solder mask patch confines the interconnect structure over the first interconnect site and second interconnect site.

10. The method of claim 9, further including disposing a semiconductor die over the substrate, the semiconductor die including a third interconnect site disposed over the first interconnect site.

11. The method of claim 9, wherein the interconnect structure includes a fusible portion and non-fusible portion.

12. The method of claim 9, wherein forming the interconnect structure includes forming a conductive pillar and disposing a bump over the conductive pillar.

13. The method of claim 9, further including forming a conductive trace over the substrate, the conductive trace including the first interconnect site.

14. The method of claim 13, further including forming a second physically separate solder mask patch over the conductive trace.

15. A method of making a semiconductor device, comprising:
   providing a substrate including an array of first interconnect sites; and
   forming a plurality of physically separate solder mask patches over the substrate disposed interstitially between and physically isolated from the array of first interconnect sites.

16. The method of claim 15, further including disposing a semiconductor die over the substrate, the semiconductor die including an array of second interconnect sites disposed over the array of first interconnect sites.

17. The method of claim 16, further including forming an interconnect structure over the first interconnect sites or second interconnect sites.

18. The method of claim 17, wherein forming the interconnect structure includes forming a conductive pillar and disposing a bump over the conductive pillar.

19. The method of claim 15, further including forming a conductive trace over the substrate, the conductive trace including the first interconnect site.

20. The method of claim 19, further including forming the conductive trace with an angled portion extending away from the first interconnect site.

21. The method of claim 19, further including forming one solder mask patch of the plurality of physically separate solder mask patches over the conductive trace.

22. The method of claim 1, further including forming a conductive trace over the substrate, the conductive trace including one first interconnect site of the array of first interconnect sites.

23. The method of claim 22, further including forming one solder mask patch of the plurality of physically separate solder mask patches over the conductive trace.

24. The method of claim 4, further including forming a conductive trace over the substrate, the conductive trace including one first interconnect site of the array of first interconnect sites.

25. The method of claim 24, further including forming one solder mask patch of the physically separate solder mask patches over the conductive trace.

* * * * *